(12) United States Patent
Kiso

(10) Patent No.: US 6,807,126 B2
(45) Date of Patent: Oct. 19, 2004

(54) SEMICONDUCTOR MEMORY DEVICE AND ELECTRONIC INFORMATION DEVICE USING THE SAME

(75) Inventor: Hiroshi Kiso, Tenri (JP)

(73) Assignee: Sharp Kabushiki Kaisha, Abeno-ku (JP)

(*) Notice: Subject to any disclaimer, the term of this patent is extended or adjusted under 35 U.S.C. 154(b) by 11 days.

(21) Appl. No.: 10/360,213

(22) Filed: Feb. 7, 2003

(65) Prior Publication Data

US 2003/0151972 A1 Aug. 14, 2003

(30) Foreign Application Priority Data

Feb. 13, 2002 (JP) ........................................ 2002-035941

(51) Int. Cl.[7] ................................................ G11C 8/00
(52) U.S. Cl. .................. 365/233; 365/365; 365/230.01; 365/230.06; 365/230.08
(58) Field of Search ............................ 365/233, 230.01, 365/230.06, 230.08

(56) References Cited

U.S. PATENT DOCUMENTS 6,628,564 B1 * 9/2003 Takita et al. ............ 365/230.06

FOREIGN PATENT DOCUMENTS

JP        08-161286        6/1996

* cited by examiner

Primary Examiner—Van Thu Nguyen
Assistant Examiner—Pho M. Luu
(74) Attorney, Agent, or Firm—Morrison & Foerster LLP

(57) ABSTRACT

In a semiconductor memory device for performing a memory operation by controlling an internal voltage and a memory operation voltage, a cycle of an internal clock signal is varied in accordance with operation time characteristics of the memory operation.

20 Claims, 17 Drawing Sheets

SEMICONDUCTOR MEMORY DEVICE AND ELECTRONIC INFORMATION DEVICE USING THE SAME

BACKGROUND OF THE INVENTION

1. Field of the Invention

The present invention relates to a semiconductor memory device used for an electronic information device such as a cellular phone, for example, a flash memory, and an electronic information device using such a semiconductor memory device.

2. Description of the Related Art

Conventionally, a flash memory performs a memory operation such as data write or data erase by controlling an operation of raising or lowering an internal voltage and an operation of applying a pulse voltage for writing information to a memory cell or a pulse voltage for erasing information from a memory cell. Such a control is performed in synchronization with an internal clock signal generated in a control circuit.

FIG. 9 is a block diagram illustrating a partial structure of a conventional general flash memory.

As shown in FIG. 9, the flash memory includes a memory array 11 having a plurality of memory cells (not shown) arranged in a row direction and a column direction. The memory cells are provided at intersections of a plurality of word lines (not shown) arranged in the row direction and a plurality of bit lines (not shown) arranged in the column direction. Each memory cell is connected to a word line and a bit line crossing each other in the vicinity of the memory cell. The memory array 11 includes an X decoder 11a for selecting a word line among the plurality of word lines, and a Y decoder 11b for selecting a bit line among the plurality of bit lines. The X decoder 11a and the Y decoder 11b each receive an address from an address pad 12 via an input buffer 13, an address counter 14 and an address multiplexer 15. In accordance with the address, a word line and a bit line are selected by the X decoder 11a and the Y decoder 11b. To the memory cell connected to the selected word line and bit line, data which is input from an I/O pad 16 via an input buffer 17 and a data register 18 is written. Data which is written to the memory cell is output from the Y decoder 11b to the I/O pad 16 via an output multiplexer 19 and an output buffer 20.

The input buffer 13 connected to the address pad 12, and the input buffer 17 and the output pad 20 connected to the I/O pad 16, are controlled by an input/output logic 21.

The input/output logic 21 receives control signals such as, for example, /CE, /WE, /OE and /RP which are supplied from an external CPU. The input buffer 13, the input buffer 17 and the output buffer 20 are controlled by the control signals. By such control, an address which is input from the address pad 12 is temporarily stored in the input buffer 13, data which is input from the I/O pad 16 is temporarily stored in the input buffer 17, and data which is output to the I/O pad 16 is temporarily stored in the output buffer 20.

A command user interface 22 receives and then decodes a command. In accordance with the decoding result, the command user interface 22 performs controlling operations of, for example, (1) setting or resetting data in a status register 23, (2) switching the output multiplexer 19 to supply the output buffer 20 with data which is read from the memory array 11 and output from the Y decoder 11b or to supply the output buffer 20 with status data in the status register 23, (3) storing data input from the I/O pad 16 in the data register 18. The command which is input to the command user interface 22 is output to a write state machine 24.

When the command is input to the write state machine 24 from the command user interface 22, the write state machine 24 generates a control signal for controlling an operation of writing data which is input from the I/O pad 16 to the memory cell or erasing data from the memory cell (hereinafter, referred to as an "internal control signal"). The internal control signal generated by the write state machine 24 is supplied to an internal voltage generation circuit 25. In accordance with the internal control signal, a controlling operation of, for example, generating an internal voltage necessary to write or erase data or stopping the generation of the internal voltage, is performed. The internal control signal is also supplied to a data comparator 26 which receives data from the Y decoder 11b. In accordance with the internal control signal, the data comparator 26 for verifying data is controlled to be on or off when the data is written or erased. The internal control signal is also supplied to the address counter 14 and the address multiplexer 15 which receive an address input to the address pad 12 via the input buffer 13. When the data is erased, the address of the memory cell, the data in which is verified, is changed by the address counter 14 and the address multiplexer 15.

The internal voltage generation circuit 25 includes a voltage raising circuit for raising an externally input supply voltage so as to generate an internal voltage which is necessary to write or erase data, and a voltage dropping circuit for dropping the raised voltage. When an internal control signal for activating the internal voltage generation circuit 25 (activation signal) is input thereto from the write state machine 24, an operation of raising the internal voltage by the voltage raising circuit or an operation of dropping the internal voltage by the voltage dropping circuit is started. When an internal control signal for deactivating the internal voltage generation circuit 25 (deactivation signal) is input thereto from the write state machine 24, an operation of raising the internal voltage by the voltage raising circuit or an operation of dropping the internal voltage by the voltage dropping circuit is stopped.

With the flash memory having the above-described structure, an operation of writing data to a memory cell or erasing data from a memory cell is performed in the following manner. First, a command instructing the flash memory to, for example, write data or erase data is issued from an external CPU. When the command is input to the flash memory, the command is decoded by the write state machine 24 and a necessary internal control signal is generated in accordance with the decoding result. The internal control signal controls functional blocks in the flash memory so as to execute the operation instructed by the command.

FIG. 10 is a block diagram illustrating a partial structure of the write state machine 24 shown in FIG. 9.

As shown in FIG. 10, the write state machine 24 includes a processing circuit 101 for executing various types of processing, a control code generation circuit 102 for supplying the processing circuit 101 with a control code, an internal clock generation circuit 103 for supplying the processing circuit 101 with a timing signal (internal clock signal), and a plurality of latch registers A through F connected to the processing circuit 101.

The control code generation circuit 102 has a built-in control code (microcode) describing an algorithm used for executing the operation instructed by the command. When the command is input to the flash memory and the, instruction of the command is given to the control code generation circuit 102, the control code corresponding to the command is supplied from the control code generation circuit 102 to the processing circuit 101. In a flash memory, algorithms used for, for example, switching the voltage raising circuit or the voltage dropping circuit into an active state or an inactive state, or applying a prescribed write pulse voltage to a gate, a source and a drain of a memory cell to write data to the memory cell, are built into the control code generation circuit 102 as control codes.

The internal clock generation circuit 103 generates the internal clock signal and supplies the internal clock signal to the processing circuit 101.

The processing circuit 101 sequentially decodes the control codes in synchronization with the internal clock signal generated by the internal clock generation circuit 103, and accesses the latch registers A through F based on the decoding results.

The processing circuit 101 is connected to each of the latch registers A through F via a latch register selection signal line 131 and a data write/read signal line 132. The processing circuit 101 accesses a prescribed one of the latch registers A through F by a latch register selection signal being supplied to the prescribed one of the latch registers A through F via the latch register selection signal line 131. The internal control signal output from the processing circuit 101 is written in the latch register which is selected by the latch register selection signal, and thus the latch data is updated. Also, data in the selected latch register is read and supplied to the processing circuit 101. Data in the latch registers A through F is supplied to the functional blocks shown in FIG. 9, i.e., the internal voltage generation circuit 25, the address counter 14, the address multiplexer 15 and the data comparator 26. Each functional block operates in accordance with the internal control signal. Thus, the algorithms described in the control codes are processed.

The cycle of the internal clock signal (also referred to as a "clock cycle") is generally determined exclusively in accordance with a condition of, for example, a supply voltage externally supplied. In this case, the cycle of the internal clock signal is set such that execution of a control code which is processed at a lowest speed among various control codes is guaranteed. The reasons are as follows.

The control codes are all processed in one clock cycle. Therefore, when the cycle of the internal clock signal is too short, the control code which is processed at the lowest speed cannot be accurately executed. The reason is that although a control code which is processed at a higher speed is properly processed, but the control code which is processed at such a low speed is not completely executed before the execution of the next control code starts. In contrast, when the cycle of the internal clock signal is set such that execution of the control code which is processed at the lowest speed among various control codes is guaranteed, the control code which is processed at a higher speed and the control code which is processed at such a low speed are both completely processed within one cycle of the internal clock signal. Thus, all the control codes are properly executed. The control codes which are processed at a low speed include, for example, control codes which describe processing of accessing a latch register farthest from the processing circuit 101 and reading data from that latch register and processing of writing data in that latch register. An exemplary control code which is processed at a high speed is, for example, an NOP code which represents that no operation is performed.

When the cycle of the internal clock signal is set such that the execution of the control code which is processed at the lowest speed among various control codes is guaranteed, the following problems arise.

The same clock cycle as that used for the control code which is processed at the lowest speed is used for the other control codes which are processed at a higher speed. Therefore, these other control codes are completely processed before the end of one cycle of the internal clock signal and a wait time is produced. A control code which is processed at a higher speed produces a longer wait time. Such a wait time, when produced at a plurality of clocks, amounts to quite a long time.

Under such a supply voltage condition as to generate a prescribed internal voltage rapidly in the internal voltage generation circuit 25 (FIG. 9), for example, under the condition that the externally input supply voltage is high, the time period required for completing the execution of the control code for deactivating the internal voltage generation circuit 25 is longer than the time period required for completing the generation of the internal voltage. Thus, the clock cycle in which the NOP code is executed is wasted.

Under such a supply voltage condition as to generate a prescribed internal voltage slowly in the internal voltage generation circuit 25 (FIG. 9), for example, under the condition that the externally input supply voltage is low, the control code for deactivating the internal voltage generation circuit 25 is executed at the time when the generation of the internal voltage is completed. Thus, the clock cycle in which the NOP code is executed is not wasted.

Hereinafter, an operation of writing data to and erasing data from a memory cell will be described as an example of an operation generating such a wasted clock cycle.

For writing data to or erasing data from a memory cell of a flash memory, a series of operations are performed as follows. The internal voltage is started to be raised in synchronization with the internal clock signal, a write pulse voltage or an erase pulse voltage is applied to the memory cell after the internal voltage is completely raised, and then the raised internal voltage is dropped.

For raising the internal voltage, the voltage raising circuit of the internal voltage generation circuit 25 is activated so as to start the voltage raising operation. In a prescribed time period, the internal voltage reaches a prescribed internal voltage level. Until this point, the NOP code is executed repeatedly. After the prescribed internal voltage level is obtained, a control code for deactivating the voltage raising circuit of the internal voltage generation circuit 25 is executed. Then, a control code for applying a write pulse voltage or an erase pulse voltage to the memory cell is executed.

A write pulse voltage is a voltage applied for writing data to a memory cell, and an erase pulse voltage is a voltage applied for erasing data from a memory cell. A start point and a termination point of each pulse voltage are described by control codes. As such, the pulse width of each pulse voltage is determined by the number of cycles of the internal clock signal which are counted from the time when a control code for starting the pulse application is executed up to the time when a control code for terminating the pulse application is executed.

In the case of the write state machine 24 shown in FIG. 10, the control code generation circuit 102 has built-in algorithms for writing data to or erasing data from a memory cell as a control code. When an instruction represented by an external command is given to the control code generation circuit 102, control codes corresponding to the command are supplied to the processing circuit 101. The processing circuit 101 sequentially decodes the control codes supplied from the control code generation circuit 102 in synchronization with the internal clock signal generated by the internal clock generation circuit 103.

The processing circuit 101 accesses the latch registers A through F based on the control codes. Then, the latch registers A through F output an internal control signal for controlling a data write operation or a data erase operation to various functional blocks in the flash memory.

For example, the latch register A outputs a voltage raising circuit activation signal for raising the voltage of the internal voltage in the following manner. When the control code generation circuit 102 supplies the processing circuit 101 with a code for writing data "1" to the latch register A and the processing circuit 101 decodes the control code, the processing circuit 101 writes data "1" to the latch register A. The voltage raising circuit activation signal which is output from the latch register A is turned to "1" and supplied to the voltage raising circuit of the internal voltage generation circuit 25. Thus, the voltage raising circuit starts the voltage raising operation of the internal voltage. When the control code generation circuit 102 supplies the processing circuit 101 with a control code for writing data "0" to the latch register A and the processing circuit 101 decodes the control code, the processing circuit 101 writes data "0" to the latch register A. The voltage raising circuit activation signal which is output from the latch register A is turned to "0" and supplied to the voltage raising circuit of the internal voltage generation circuit 25. Thus, the voltage raising circuit stops the voltage raising operation of the internal voltage.

The latch register B outputs a voltage dropping circuit activation signal for dropping the voltage of the internal voltage in the following manner. When the control code generation circuit 102 supplies a code for writing data "1" to the latch register B to the processing circuit 101 and the processing circuit 101 decodes the control code, the processing circuit 101 writes data "1" to the latch register B. The voltage dropping circuit activation signal which is output from the latch register B is turned to "1" and supplied to the voltage dropping circuit of the internal voltage generation circuit 25. Thus, the voltage dropping circuit starts the voltage dropping operation of the internal voltage. When the control code generation circuit 102 supplies a code for writing data "0" to the latch register B to the processing circuit 101 and the processing circuit 101 decodes the control code, the processing circuit 101 writes data "0" to the latch register B. The voltage dropping circuit activation signal which is output from the latch register B is turned to "0" and supplied to the voltage dropping circuit of the internal voltage generation circuit 25. Thus, the voltage dropping circuit stops the voltage raising operation of the internal voltage.

The latch register D outputs a pulse application activation signal for applying a write pulse voltage or an erase pulse voltage to the memory cell in the following manner. When the control code generation circuit 102 supplies a code for writing data "1" to the latch register D to the processing circuit 101 and the processing circuit 101 decodes the control code, the processing circuit 101 writes data "1" to the latch register D. The pulse application activation signal which is output from the latch register D is turned to "1" and supplied to the internal voltage generation circuit 25. Thus, the application of the write pulse voltage or the erase pulse voltage to the memory cell is started. When the control code generation circuit 102 supplies a code for writing data "0" to the latch register D to the processing circuit 101 and the processing circuit 101 decodes the control code, the processing circuit 101 writes data "0" to the latch register D. The pulse application activation signal which is output from the latch register D is turned to "0" and supplied to the voltage dropping circuit of the internal voltage generation circuit 25. Thus, the application of the write pulse voltage or the erase pulse voltage to the memory cell is terminated. Outputs from the latch registers C, E and F are supplied to the other functional blocks such as, for example, the data comparator 26 (FIG. 9) and the address counter 14 as internal control signals.

FIG. 11 is a flowchart illustrating an operation of executing the algorithm by the write state machine 24 shown in FIG. 10. As shown in FIG. 11, the internal voltage is raised for an operation of writing data to or erasing data from the memory cell, next a write pulse voltage or an erase pulse voltage is applied, and then the raised internal voltage is dropped. Thus, the execution of the algorithm is terminated. The numbers of clocks shown in FIG. 11 are merely exemplary and the present invention is not limited to these numbers.

As shown in FIG. 11, the processing circuit 101 accesses the latch register A at the first clock, and the voltage raising circuit activation signal is enabled so as to start raising the internal voltage (step 21). The voltage raising operation is completed by the seventh clock.

During this period, all the write state machine 24 does is to instruct the internal voltage generation circuit 25 at the beginning to start the voltage raising operation using the voltage raising circuit activation signal. After that, the write state machine 24 repeats execution of the NOP code a prescribed number of times until the voltage raising operation is completed. The internal voltage generation circuit 25 includes a clock generation circuit (not shown) for a charge pump. The voltage raising rate of the charge pump is asynchronous with the internal clock signal generated by the write state machine 24.

At the seventh clock, the processing circuit 101 accesses the latch register D, and the pulse application activation signal is enabled so as to start the application of a write pulse voltage or an erase pulse voltage (step 22). In the case where the pulse width required for data write or data erase is four clocks, the processing circuit 101 accesses the latch register D before the 11th clock. At the 11th clock, the pulse application activation signal is disabled so as to terminate the application of the write pulse voltage or the erase pulse voltage.

During the four clocks, the write state machine 24 starts applying the write pulse voltage or the erase pulse voltage to the memory cell and supplies the pulse application activation signal to the internal signal generation circuit 25, so as to start the application of the voltage to the memory cell by the internal signal generation circuit 25. Until the prescribed pulse width required for data write or data erase is obtained, the execution of the NOP code is repeated a prescribed number of times. Then, the write state machine 24 supplies a pulse application deactivation signal to the internal signal generation circuit 25, so as to terminate the application of the voltage to the memory cell by the internal signal generation circuit 25.

The write pulse voltage or the erase pulse voltage is applied to the memory cell by the prescribed internal voltage being raised by the internal signal generation circuit 25 for a prescribed pulse width which is set by the write state machine 24. Thus, data is written to or erased from the memory cell. When the pulse width of the write pulse voltage or the erase pulse voltage is too short, there is a risk that the data is not sufficiently written or erased.

At the 11th clock, the processing circuit 101 accesses the latch register B, and the voltage dropping circuit activation signal is enabled so as to start dropping the internal voltage (step 23). When the voltage dropping operation is completed in four clocks, the control of the algorithm by the write state machine 24 is terminated at the 15th clock (step 24).

During this period, all the write state machine 24 does is to instruct the internal voltage generation circuit 25 at the beginning to start the voltage dropping operation using the voltage dropping circuit activation signal. After that, the write state machine 24 repeats execution of the NOP code a prescribed number of times until the voltage dropping operation is completed. The internal voltage generation circuit 25 includes a clock generation circuit (not shown). The voltage dropping rate of the clock generation circuit is asynchronous with the internal clock signal generated by the write state machine 24.

FIGS. 12 through 14 are each a timing diagram illustrating the relationship among the internal clock signal, the internal voltage, and the pulse application activation signal. FIGS. 12 through 14 show waveforms of the internal clock signal and the pulse application activation signal.

FIG. 12 shows one example of the above-mentioned relationship which is obtained in the case where the cycle of the internal clock signal is designed so as not to change much in accordance with a change in the externally input supply voltage. FIG. 12 shows the relationship obtained under the condition that the voltage raising operation of the internal voltage is performed at a lowest speed, for example, when the externally input supply voltage is low. In this case, the operator describes a control code in the control code generation circuit 102 such that (i) the pulse application activation signal is enabled at a number of clocks at which the pulse voltage can be started to be applied quickly after the internal voltage is completely raised (i.e., at the seventh clock), (ii) the pulse application activation signal is disabled at a number of clocks at which the pulse width required for data write or data erase is obtained (i.e., at the 11th clock), and (iii) the processing is terminated at a number of clocks at which the internal voltage is completely dropped (i.e., at the 15th clock). Then, a pulse voltage having a desired pulse width is generated in accordance with the control code described by the operator. In order to design the cycle of the internal clock signal so as not to change much in accordance with a change in the externally input supply voltage, a constant level of voltage is supplied as a supply voltage of the internal clock generation circuit 103 using a reference circuit which can output a constant level of voltage. Such a reference voltage will not described in detail herein.

When the control code is described for the condition that the voltage raising operation of the internal voltage is performed at the lowest speed as described above, no extra wait time is produced from the completion of the voltage raising operation of the internal voltage until the start of the application of the pulse voltage. The pulse width required for data write or data erase is not shortened. After the pulse voltage is applied, no extra wait time is produced from the completion of the voltage dropping operation of the internal voltage until the termination of the processing.

FIG. 13 shows one example of the above-mentioned relationship which is obtained under the condition that the voltage raising operation of the internal voltage is performed at a highest speed, for example, when the externally input supply voltage is high. In this case, extra wait time is produced from the completion of the voltage raising operation of the internal voltage until the start of the application of the pulse voltage. The width of the pulse applied for data write or data erase is controlled in synchronization with the internal clock signal by the write state machine 24 and the cycle of the internal clock signal is designed so as not to change much in accordance with a change in the externally input supply voltage. Therefore, the width of the pulse applied for data write or data erase is not shortened.

FIG. 14 shows one example of the above-mentioned relationship which is obtained in the case where the cycle of the internal clock signal is designed so as to change in accordance with a change in the externally input supply voltage. FIG. 14 shows the relationship obtained under the condition that the voltage raising operation of the internal voltage is performed at a highest speed. Even under such a condition, no extra wait time is produced while the internal voltage is being raised and dropped. However, the width of the pulse applied for data write or data erase is shortened. Therefore, a pulse width cannot be maintained to be sufficient to keep the write characteristics and the erase characteristics constant.

Hereinafter, the write state machine 24 shown in FIG. 10 will be described in the case where the latch registers A through C are located relatively close to the processing circuit 101 and the latch registers D through F are located relatively far from the processing circuit 101. Herein, whether a latch register is "far from" or "close to" the processing circuit 101 is determined based on whether accessing the latch register by the processing circuit 101 is time-consuming or not.

FIG. 15 is a flowchart illustrating a flow of an accessing operation by the processing circuit 101 in the write state machine 24 (FIG. 10) to the latch registers A through F. FIG. 16 is a timing diagram illustrating the relationship between the internal clock signal and the accessing operation by the processing circuit 101 to the latch registers A through F.

One latch register is accessed in one clock cycle. In step 31, the latch registers A, B and C located relatively close to the processing circuit 101 are sequentially accessed. In step 32, the latch registers D, E and F located relatively far from the processing circuit 101 are sequentially accessed. In step 33, the latch registers A, B and C located relatively close to the processing circuit 101 are sequentially accessed.

In the conventional semiconductor memory device, the cycle of the internal clock signal is set such that an access time to the latch registers D through F which is longer than an access time to the latch registers A through C is guaranteed.

Japanese Laid-Open Publication No. 8-161286, for example, discloses a microprocessor for raising the speed of calculation by changing the cycle of the clock signal in accordance with the type of calculation instructions. An addition and a multiplication, for example, require different lengths of time. Therefore, the microprocessor described in the above-mentioned publication can change the cycle of the clock signal in accordance with the required length of time for each type of calculation.

For writing data to a memory cell of a flash memory, for example, data is stored in the memory cell by increasing or decreasing the threshold voltage of the memory cell, such that, for example, the threshold voltage for data "0" is high and the threshold voltage for data "1" is low. The variance of the threshold voltage representing data "0" is preferably as small as possible. In order to keep the variance sufficiently small, the write characteristics need to be kept constant so as to prevent, for example, the following situation: the application time of the write pulse voltage is very short and the threshold voltage cannot be raised high, and the application time of the write pulse voltage is very long and the threshold voltage becomes too high. The same is true with data erase from the memory cell. As described above, in order to keep the write characteristics or the erase characteristics constant when the data write to or data erase from the memory cell is performed, it is preferable to keep the level of the pulse voltage applied to the memory cell and the application time thereof constant regardless of the supply voltage.

In order to shorten the data write time and the data erase time, it is preferable to shorten, as much as possible, the time required for operations other than the operation of applying a write pulse voltage and an erase pulse voltage; for example, the operation of raising the internal voltage and the operation of dropping the internal voltage.

In the conventional flash memory, in the case where the operation of raising the internal voltage, the operation of dropping the internal voltage, the operation of applying a write pulse voltage to the memory cell, and the operation of applying an erase pulse voltage to the memory cell are controlled in synchronization with the internal clock signal, the cycle of the internal clock signal is kept constant from when a write command or an erase command is input until the write operation or the erase operation is completed, provided the supply voltage is constant. Therefore, if the cycle of the clock signal is changed in accordance with the voltage characteristics of the internal voltage raising circuit and the internal voltage dropping circuit, the application time of the write pulse voltage and the application time of the erase pulse voltage are also changed and cannot be kept constant.

In order to keep constant the application time of the write pulse voltage and the application time of the erase pulse voltage, it is possible to maintain the cycle of the internal clock signal constant regardless of the supply voltage. In this case, controls are sequentially performed at a number of clocks required to guarantee the operation under the voltage condition that the circuit operation is performed at a lowest speed, other than the controls for the application time of the write pulse voltage and the application time of the erase pulse voltage. Even with the supply voltage allowing for a faster circuit operation, the next control is performed after the same number of clocks. Therefore, extra wait time is produced.

In a flash memory in which data of the internal control signal latched in a latch register is updated in synchronization with the internal clock signal, the cycle of the internal clock signal is set to be the cycle which is required to guarantee that the processing circuit 101 can access the latch register which requires the longest access time, among a plurality of latch registers. Therefore, when the processing circuit 101 accesses the latch register which requires the shortest access time, extra wait time is produced. For example, referring to FIG. 10, the latch registers D through F located relatively far from the processing circuit 101 require a longer time to complete the data update operation than the latch registers A through C located relatively close to the processing circuit 101. Therefore, extra wait time is produced when the data is updated in the latch registers A through C, which prevents enhancement in the processing speed. The same is true with the read operation of the latch data.

In order to activate or deactivate each functional block such as the internal voltage generation circuit 25 and the data comparator 26 (FIG. 9) in a flash memory, data "1" or data "0" is supplied from the processing circuit 101 to the latch register which outputs the activation signal of the functional block, and is stored in the latch register.

Accordingly, one same instruction, i.e., "store instruction" is used by the control code for controlling each functional block of the flash memory. The latch register which is to store the data is designated by designating the address of that latch register in the control code. Thus, the functional block which is to be controlled is selected. Thus, the same store instruction is used for controlling operations other than the operation of applying the write pulse voltage and the operation of applying the erase pulse voltage; for example, the operation of raising the internal voltage and the operation of dropping the internal voltage.

In the case of the microprocessor disclosed by Japanese Laid-Open Publication No. 8-161286, the cycle of the clock signal can be changed by the type of instruction. For example, the store instruction is executed at a certain clock cycle every time, and the AND instruction is executed at another clock cycle every time.

However, when the technique of the microprocessor disclosed by Japanese Laid-Open Publication No. 8-161286 is used for a flash memory, the following phenomenon occurs. An internal clock having the same cycle is generated both when controlling the operation of applying a write pulse voltage or an erase pulse voltage and when controlling the operation of raising or dropping the internal voltage. The reason is that the store instruction is executed at the same cycle every time. For the same reason, an internal clock having the same cycle is generated both when accessing latch registers A through C located relatively close to the processing circuit 101 and when accessing latch registers C through F located relatively far from the processing circuit 101.

Accordingly, the technique of the microprocessor disclosed by Japanese Laid-Open Publication No. 8-161286 cannot be used to change the clock cycle in accordance with whether the application operation is performed or the voltage raising or dropping operation is performed. Nor can it be used to change the clock cycle in accordance with whether the latch registers A through C close to the processing circuit 101 are to be accessed or the latch, registers D through F far from the processing circuit 101 are to be accessed.

SUMMARY OF THE INVENTION

According to one aspect of the invention, in a semiconductor memory device for performing a memory operation by controlling an internal voltage and a memory operation voltage, a cycle of an internal clock signal is varied in accordance with operation time characteristics of the memory operation.

In one embodiment of the invention, in the semiconductor memory device for performing a memory operation such as data write to or data erase from a memory cell by sequentially controlling raising of an internal voltage to a prescribed voltage, application of a memory operation voltage for writing data to or erasing data from the memory cell, and dropping of the raised internal voltage to a prescribed voltage, a cycle of an internal clock signal is varied in accordance with an operation time characteristic of the memory operation.

In one embodiment of the invention, the semiconductor memory device includes an internal clock generation circuit for generating the internal clock signal with different cycles; and an internal control signal generation circuit for generating a first internal control signal for controlling the cycle of the internal clock signal to be switched in accordance with the operation time characteristics when the internal voltage is raised and when the internal voltage dropped and operation time characteristics when the write voltage is applied and when the erase voltage is applied.

In one embodiment of the invention, the internal control signal generation circuit generates the first internal control signal for switching the cycle of the internal clock signal, such that the cycle of the internal clock signal for controlling the raising of the internal voltage and the dropping of the raised internal voltage is shorter than the cycle of the internal clock signal for controlling the application of the write voltage and the erase voltage.

In one embodiment of the invention, the semiconductor memory device includes an internal clock generation circuit for generating the internal clock signal with different cycles; and an internal control signal generation circuit including a plurality of latch sections capable of latching latch data and a processing circuit for accessing the plurality of latch sections to write and read the latch data in synchronization with the internal clock signal. The internal control signal generation circuit generates a second internal control signal for controlling the cycle of the internal clock signal to be switched in accordance with the operation time characteristics when the processing circuit accesses the latch sections, and outputting the second internal control signal to the internal clock generation circuit.

In one embodiment of the invention, the internal control signal generation circuit generates the second internal control signal for switching the cycle of the internal clock signal, such that the cycle of the internal clock signal when one of the latch sections which is located relatively close to the processing circuit among the plurality of latch sections is accessed is shorter than the cycle of the internal clock signal when one of the latch sections which is located far from the processing circuit among the plurality of latch sections is accessed.

In one embodiment of the invention, the semiconductor memory device includes a memory array including a plurality of memory cells in a row direction and a column direction; and an internal voltage generation circuit for raising a supply voltage to generate the internal voltage which is required for data write to and data erase from the memory cells and for dropping the raised internal voltage. The internal control signal generation circuit generates a third internal control signal for controlling the raising of the internal voltage, the dropping of the raised internal voltage performed by the internal voltage generation circuit and for controlling the application of a write pulse voltage for writing data to the memory cells and an erase pulse voltage for erasing data from the memory cells.

In one embodiment of the invention, the internal control signal generation circuit includes a control code generation circuit having a built-in control code describing an algorithm for executing an operation instructed by an externally input command. The internal control signal generation circuit generates the first internal control signal such that the control code generation circuit supplies the control code corresponding to the command and the algorithm described in the control code is sequentially executed.

In one embodiment of the invention, the internal control signal generation circuit further includes a clock cycle control signal generation section for supplying the internal clock generation circuit with a clock cycle control signal as the first or the second internal control signal for varying the cycle of the internal clock signal. The control code generation circuit further stores a control code for extending the cycle of the internal clock signal and a control code for shortening the cycle of the internal clock signal. When the control code for extending the cycle of the internal clock signal is supplied to the internal control signal generation circuit from the control code generation circuit, the clock cycle control signal generation section outputs the first or the second internal control signal for extending the cycle of the internal clock signal to the internal clock generation circuit. When the control code for shortening the cycle of the internal clock signal is supplied to the internal control signal generation circuit from the control code generation circuit, the clock cycle control signal generation section outputs the first or the second internal control signal for shortening the cycle of the internal clock signal to the internal clock generation circuit.

In one embodiment of the invention, the internal control signal generation circuit further includes a clock cycle control signal latch section for supplying the internal clock generation circuit with a clock cycle control signal as the first or the second internal control signal for varying the cycle of the internal clock signal. The control code generation circuit further stores a control code for extending the cycle of the internal clock signal and a control code for shortening the cycle of the internal clock signal. When the control code for extending the cycle of the internal clock signal is supplied to the internal control signal generation circuit from the control code generation circuit, latch data in the clock cycle control signal latch section is updated and the clock cycle control signal latch section outputs the first or the second internal control signal for extending the cycle of the internal clock signal to the internal clock generation circuit. When the control code for shortening the cycle of the internal clock signal is supplied to the internal control signal generation circuit from the control code generation circuit, latch data in the clock cycle control signal latch section is updated and the clock cycle control signal latch section outputs the first or the second internal control signal for shortening the cycle of the internal clock signal to the internal clock generation circuit.

In one embodiment of the invention, the control code for extending the cycle of the internal clock signal is supplied from the control code generation circuit to the internal control signal generation circuit when an operation for applying a write pulse voltage or an erase pulse voltage to the memory cells as the write voltage or the erase voltage is controlled or when a latch section which is located relatively far from the processing circuit is accessed, and the control code for shortening the cycle of the internal clock signal is supplied from the control code generation circuit to the internal control signal generation circuit when an operation for applying a write pulse voltage or an erase pulse voltage to the memory cells as the write voltage or the erase voltage is controlled or when a latch section which is located relatively close to the processing circuit is accessed.

According to another aspect of the invention, an electronic information device uses one of the above-described semiconductor memory device to vary the cycle of the internal clock signal in accordance with an operation time characteristic of the memory operation so as to shorten a time required for the memory operation.

The function of the present invention will be descried.

According to the present invention, the internal control signal generation circuit controls the internal clock generation circuit, so that the cycle of the internal clock signal is switchable. For raising or dropping the internal voltage, the cycle of the internal clock signal is set to a clock cycle which is suitable for the voltage characteristic (operation time characteristic) of the voltage raising circuit or the voltage dropping circuit in the internal voltage generation circuit. For example, assuming that the time required for the voltage to reach a desired level under the condition of a high supply voltage is ½ times the time required for the voltage to reach a desired level under the condition of a low supply voltage, the cycle of the internal clock under the condition of the high supply voltage is set to be ½ of the cycle of the internal clock under the condition of the low supply voltage. According to the present invention, the cycle of the internal clock signal can be set to a cycle which is suitable for the voltage characteristic (operation time characteristic) of the voltage raising circuit or the voltage dropping circuit in the internal voltage generation circuit. Therefore, regardless of whether the condition of a high supply voltage or the condition of a low supply voltage is used, extra wait time which is conventionally produced, is prevented from being produced from the completion of the voltage raising operation of the internal voltage until the start of the application of a write pulse voltage or an erase pulse voltage, and from the completion of the voltage dropping operation of the internal voltage until the termination of the processing, respectively.

After the voltage raising operation of the internal voltage is completed, the cycle of the internal clock signal is switched to a clock cycle which is suitable for the data write and data erase (operation time characteristic) with the dependability on the supply voltage being minimized, immediately before the write pulse voltage or the erase pulse voltage is applied to the memory cell. Conventionally, for example, in the condition of a low supply voltage, the clock cycle suitable for the voltage characteristic of the voltage raising circuit or the voltage dropping circuit is relatively long. Therefore, the write pulse voltage or the erase pulse voltage obtains a sufficient long pulse width to properly perform data write or data erase. However, under the condition of a high supply voltage, the clock cycle suitable for the voltage characteristic of the voltage raising circuit or the voltage dropping circuit is relatively short. Therefore, the pulse width of the write pulse voltage or the erase pulse voltage cannot be sufficiently long to properly perform data write or data erase (i.e., the operation time is insufficient). This inconvenience is avoided according to the present invention by extending the clock cycle immediately before the write pulse voltage or the erase pulse voltage is applied, so that the write pulse voltage or the erase pulse voltage obtains a sufficient long pulse width to properly perform data write or data erase.

After the application of the write pulse voltage or the erase pulse voltage is terminated, the clock cycle is returned to a clock cycle which is suitable for the voltage characteristic (operation time characteristic) of the voltage dropping circuit. Therefore, regardless of whether the externally input supply voltage is high or low, extra wait time as conventionally produced is not produced from the completion of the voltage dropping operation of the internal voltage until the termination of the processing.

As a result, the speed of data write to and data erase from a memory cell can be enhanced by reducing extra wait time when the internal voltage is raised and dropped, and the write characteristics and the erase characteristics can be maintained constant by guaranteeing a sufficient pulse width for the write pulse voltage and the erase pulse voltage.

Also according to the present invention, latch sections are accessed by a processing circuit in synchronization with the internal clock signal so as to update the latch data on the internal control signal. The cycle of the internal clock signal is set to be a clock cycle which is suitable for the operation time characteristic at the time of accessing a latch section, which is located relatively close to, and thus is accessible in a relatively short time, among the plurality of latch sections.

For accessing a latch section, which is located relatively close to, and thus is accessible in a relatively short time, the cycle of the internal clock signal is shortened. For accessing a latch section, which is located relatively farther from, and thus requires a relatively long access time, the cycle of the internal clock signal is extended.

As a result, the speed of data write to and data erase from a memory cell can be enhanced by reducing extra wait time when a latch section accessible in a short time is accessed, and the write characteristics and the erase characteristics can be maintained constant by obtaining a sufficient long access time for accessing a latch section which requires a long access time.

Thus, the invention described herein makes possible the advantages of providing a semiconductor memory device for guaranteeing a sufficient pulse width to maintain the data write characteristics to and the data erase characteristics from a memory cell constant and still shortening extra wait time at the time of raising and dropping an internal voltage so as to enhance the processing speed, and an electronic information device using the same.

These and other advantages of the present invention will become apparent to those skilled in the art upon reading and understanding the following detailed description with reference to the accompanying figures.

DESCRIPTION OF THE PREFERRED EMBODIMENTS

Figure 9:
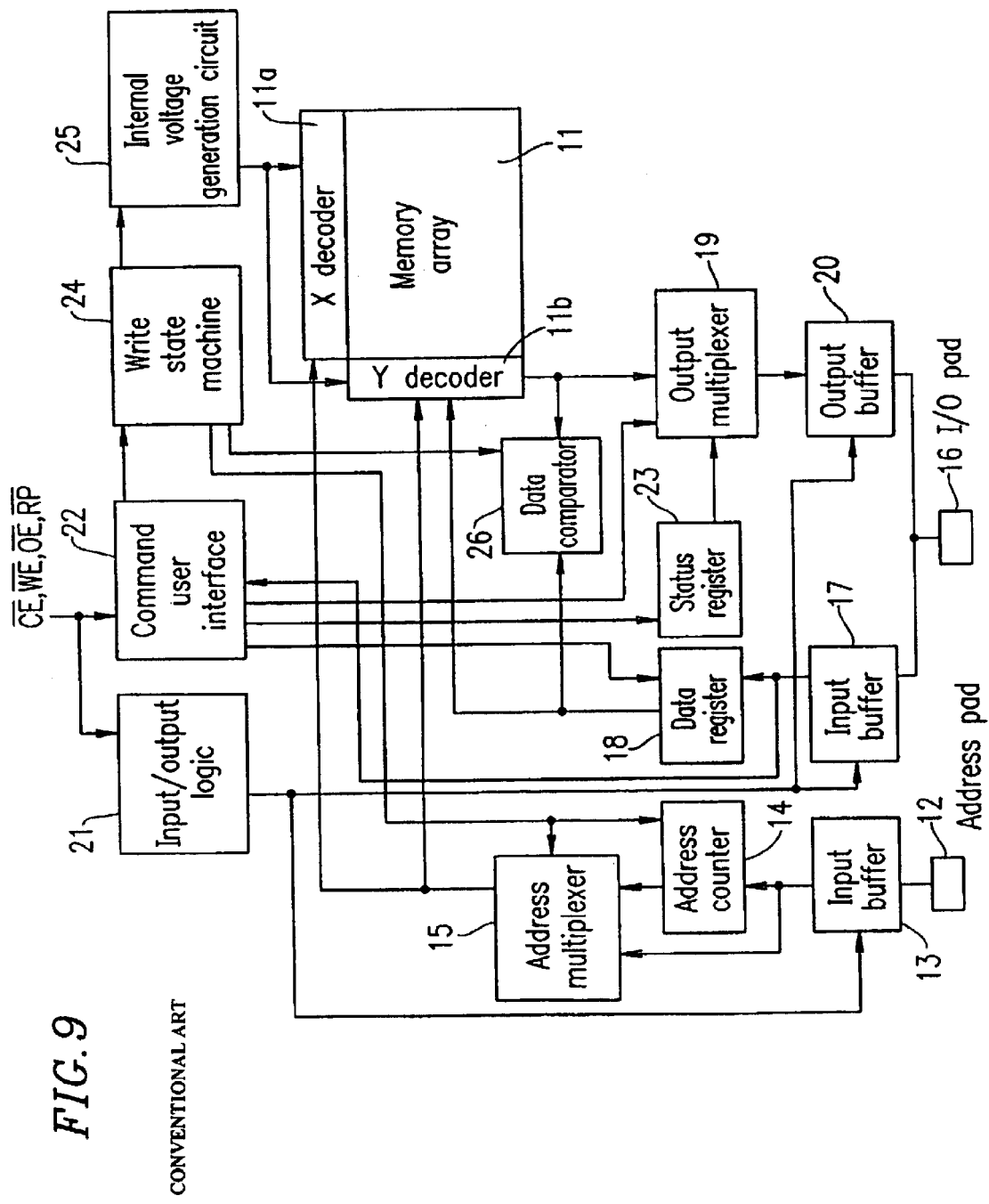
FIG. 9 is a block diagram illustrating a partial structure of a conventional, general flash memory.
Figure 10:
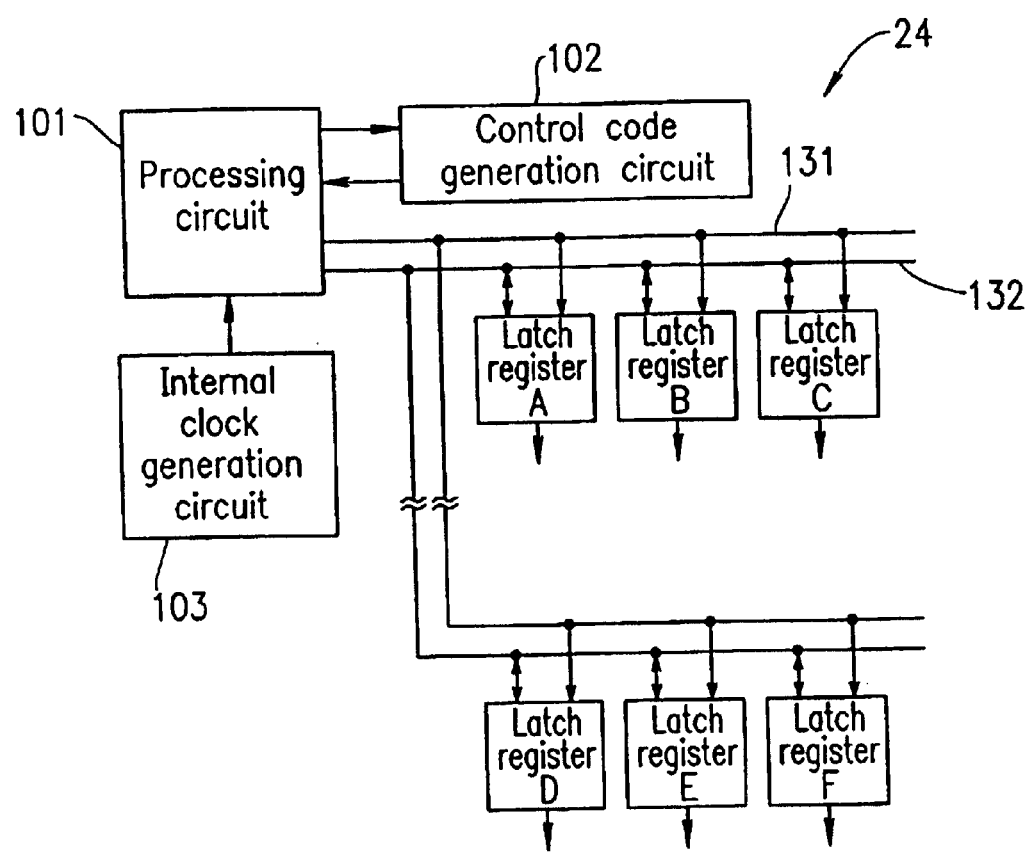
FIG. 10 is a block diagram illustrating a partial structure of a write state machine included in the conventional flash memory shown in FIG. 9.
Figure 11:
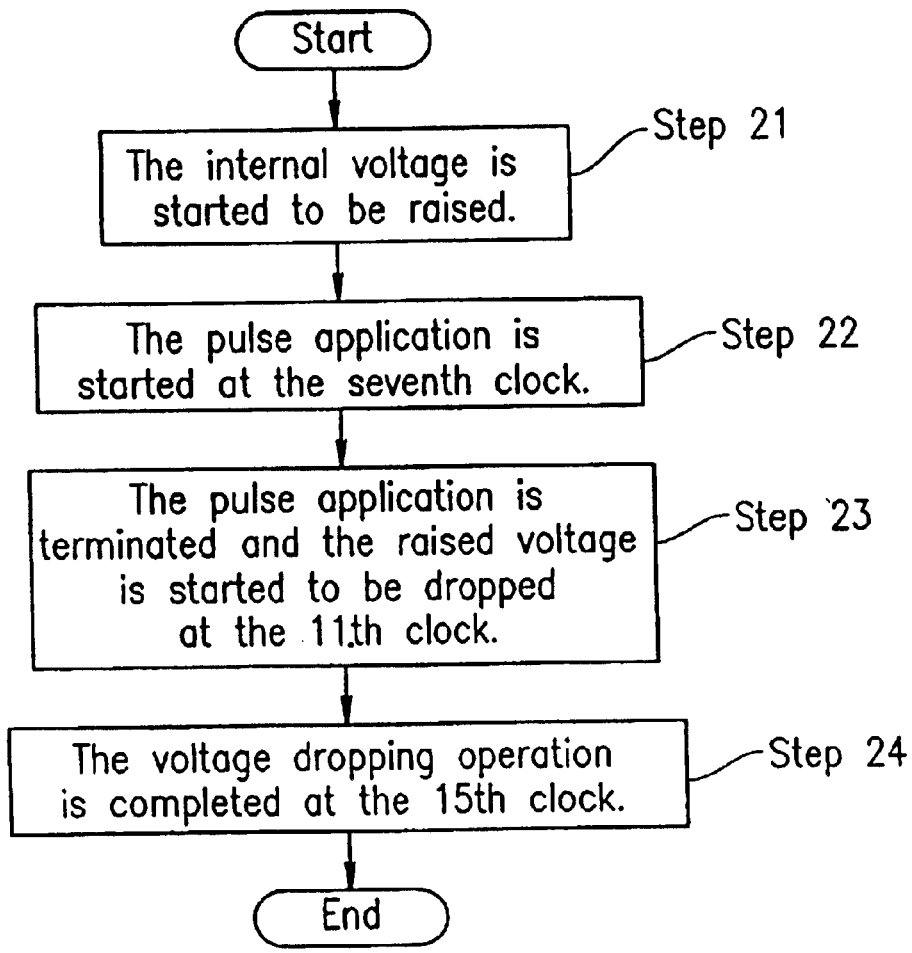
FIG. 11 is a flowchart illustrating an operation of executing an algorithm by the write state machine shown in FIG. 10.
Figure 12:
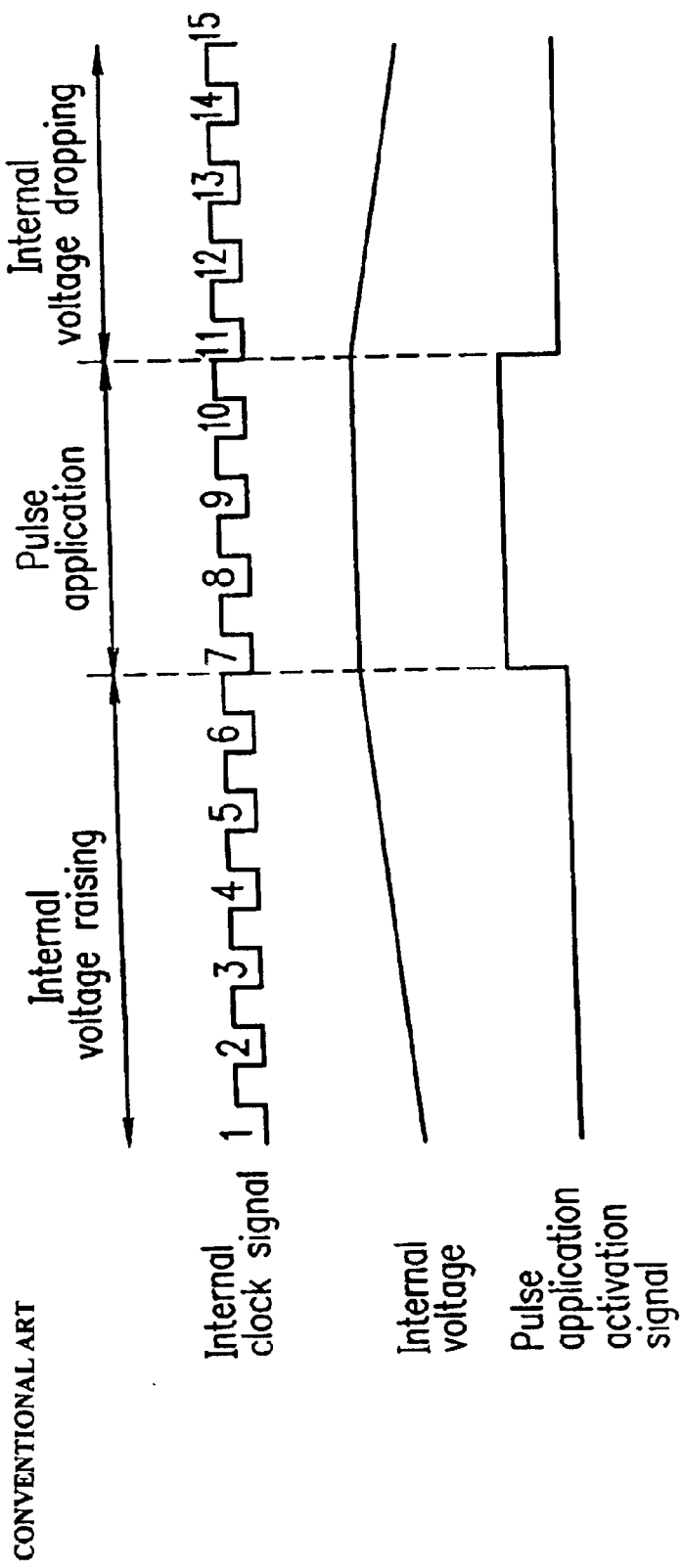
FIG. 12 is a timing diagram illustrating a relationship among an internal clock signal, an internal voltage, and a pulse application activation signal in the write state machine shown in FIG. 10.
Figure 13:
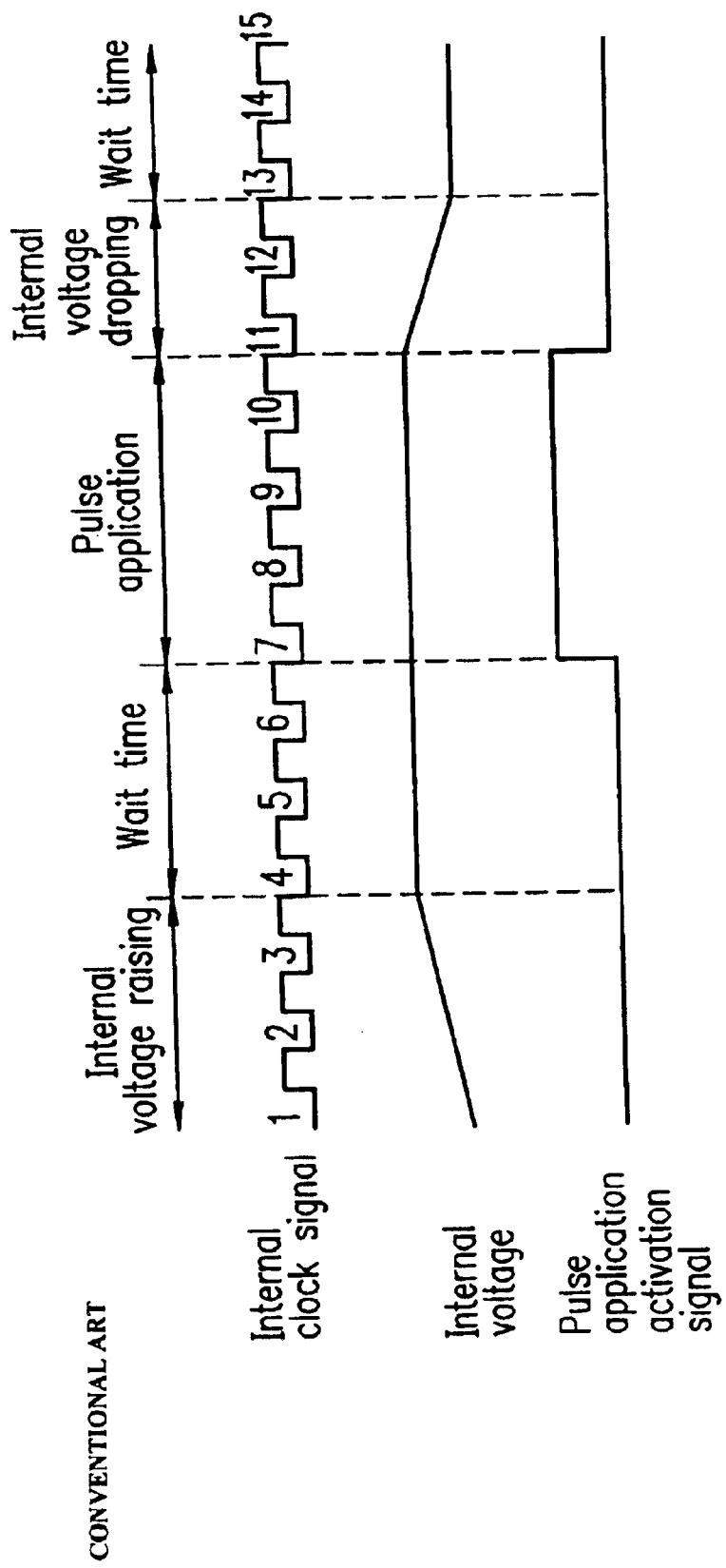
FIG. 13 is a timing diagram illustrating another relationship among an internal clock signal, an internal voltage, and a pulse application activation signal in the write state machine shown in FIG. 10.
Figure 14:
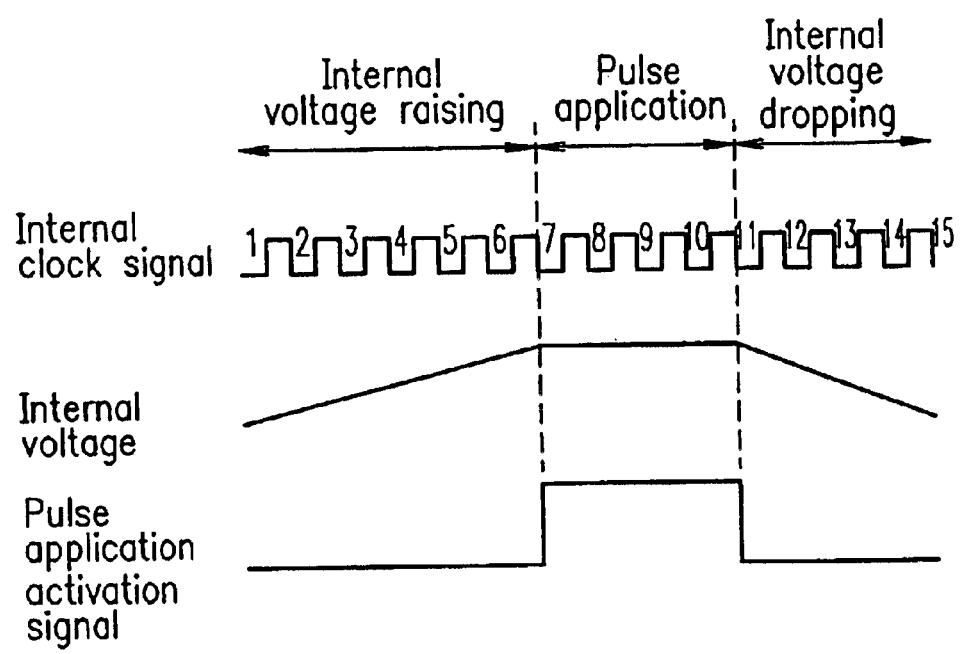
FIG. 14 is a timing diagram illustrating still another relationship among an internal clock signal, an internal voltage, and a pulse application activation signal in the write state machine shown in FIG. 10.
Figure 15:
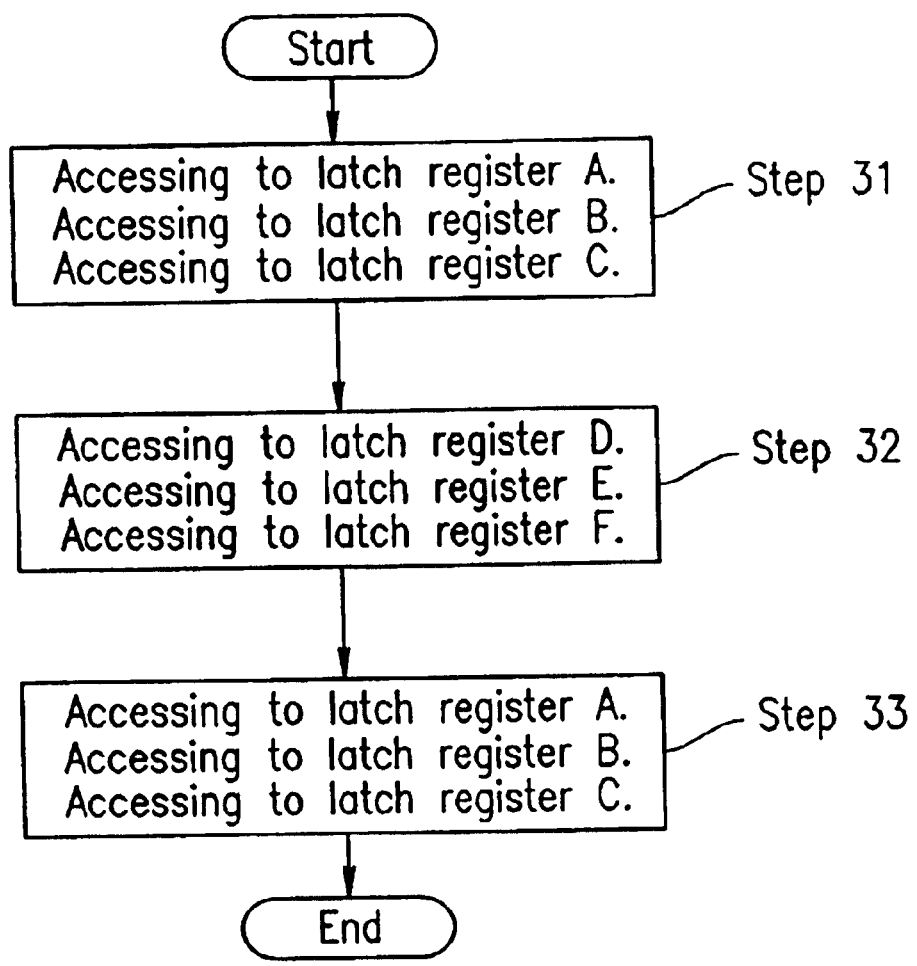
FIG. 15 is a flowchart illustrating a flow of an accessing operation from a processing circuit to latch sections in a conventional write state machine.
Figure 16:
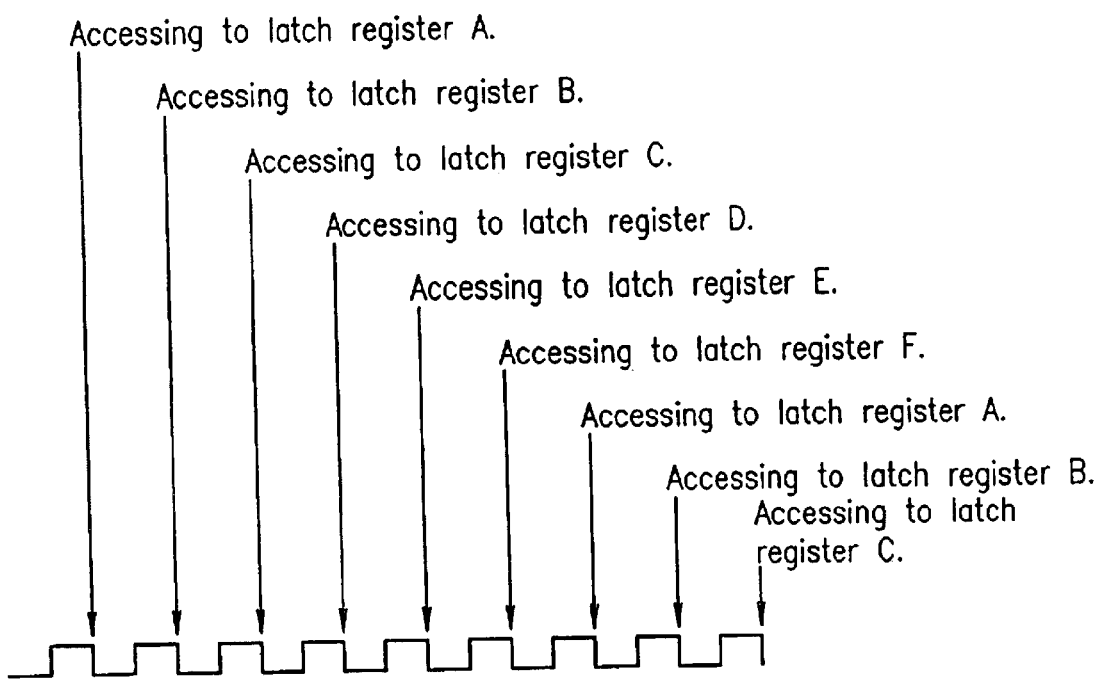
FIG. 16 is a timing diagram illustrating a relationship between an internal clock signal and an accessing operation from a processing circuit to latch sections in a conventional write state machine.

Hereinafter, the present invention will be described by way of illustrative examples with reference to the accompanying drawings. In the following examples, a semiconductor memory device according to the present invention is applied to a flash memory. The structure of the flash memory according to the present invention is the same as shown in FIG. 9 except for the write state machine. Identical elements previously discussed with respect to FIGS. 9 and 10 bear identical reference numerals and the detailed descriptions thereof will be omitted.

EXAMPLE 1

Figure 1:
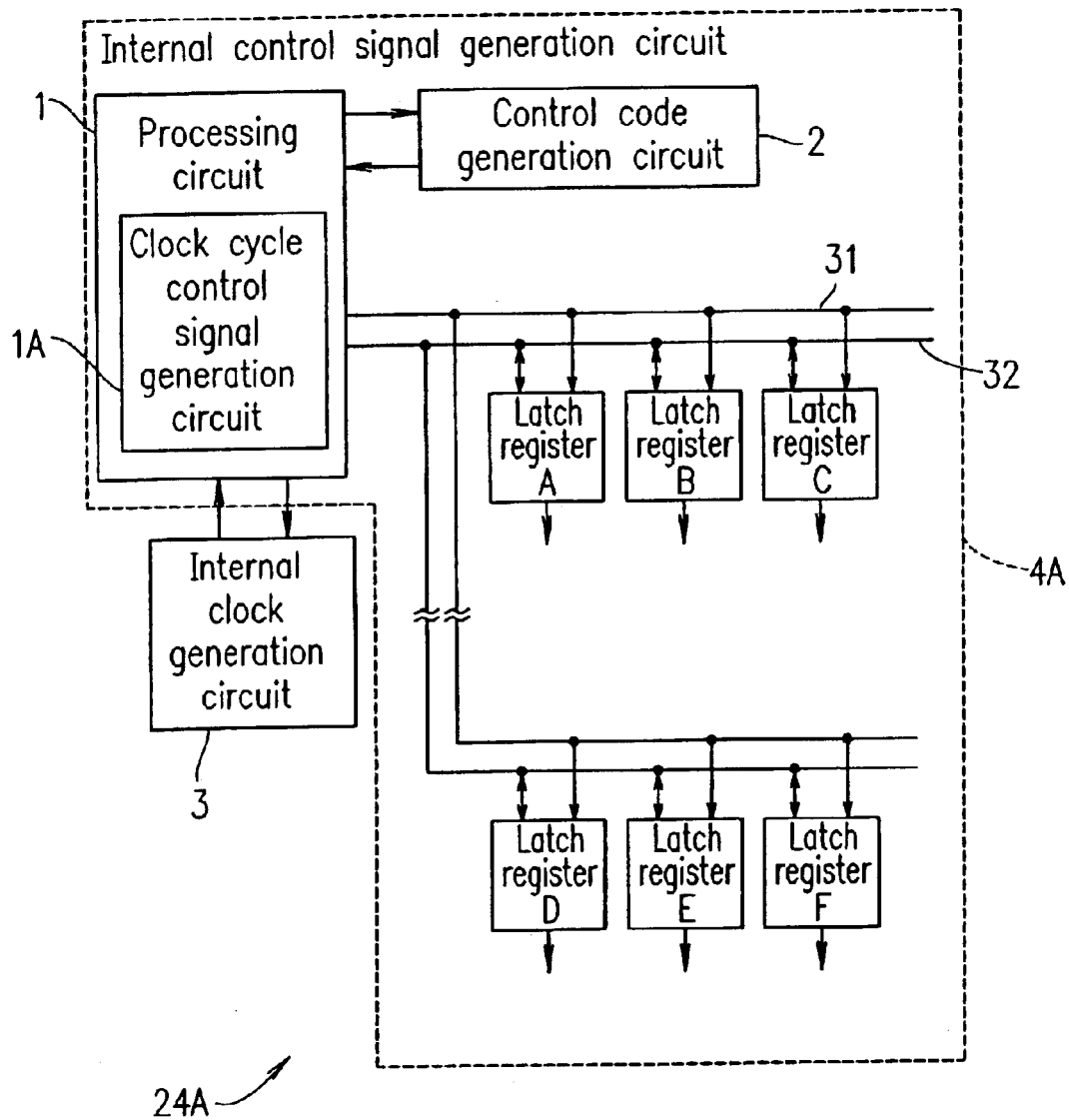
FIG. 1 is a block diagram illustrating a partial structure of a write state machine included in a flash memory according to a first example of the present invention.

FIG. 1 is a block diagram illustrating a partial structure of a write state machine 24A included in a flash memory according to a first example of the present invention.

As shown in FIG. 1, the write state machine 24A includes a processing circuit 1 for executing various types of processing, a control code generation circuit 2 for supplying the processing circuit 1 with a control code, an internal clock generation circuit 3 for supplying the processing circuit 1 with a timing signal (internal clock signal), and a plurality of latch registers A through F (latch sections) connected to the processing circuit 1. As described in detail below, the write state machine 24A can vary the cycle of the internal clock signal in accordance with an operation time characteristic of each of operations included in a memory operation of writing data to or erasing data from a memory cell (i.e., the operations of raising the internal voltage, applying a write voltage or an erase voltage, and dropping the internal voltage). An internal control signal generation circuit 4A (including a clock cycle control signal generation section 1A) includes the processing circuit 1, the control code generation circuit 2 (the control code generation circuit 2 is not an indispensable element), and the plurality of latch registers A through F (the latch registers A through F are not indispensable elements). The internal control signal generation circuit generates an internal control signal for controllably switching the cycle of the internal clock signal generated in the internal clock signal generation circuit 3, in accordance with the operation time characteristics of raising and dropping internal voltage and the operation time characteristics of the operation of applying a write voltage or an erase voltage.

The control code generation circuit 2 has a built-in control code (microcode) describing an algorithm used for executing the operation instructed by the command. When an instruction by the command is given to the control code generation circuit 2 from an external CPU or the like, a control code corresponding to the command is supplied from the control code generation circuit 2 to the processing circuit 1. When, for example, the command supplied to the flash memory from the external CPU or the like is a command instructing an operation of writing data to a memory cell or a command instructing an operation of erasing data from a memory cell, control codes describing algorithms of, for example, an operation of switching a voltage raising circuit or a voltage dropping circuit in an internal voltage generation circuit 25 (FIG. 9) into an active state or an inactive state, an operation of applying a prescribed write pulse voltage to a memory cell in order to write data to the memory cell, and an operation of applying a prescribed erase pulse voltage to a memory cell in order to erase data from the memory cell, are built into the control code generation circuit 2. One of the control codes corresponding to the command instructing each of the operations is supplied to the processing circuit 1.

The internal clock generation circuit 3 generates the internal clock signal so as to be variable and supplies the internal clock signal to the processing circuit 1.

The processing circuit 1 sequentially decodes the control codes in synchronization with the internal clock signal generated by the internal clock generation circuit 3, and accesses the latch registers A through F based on the decoding results.

The processing circuit 1 is connected to each of the latch registers A through F via a latch register selection signal line 31 and a data write/read signal line 32. The control codes supplied from the control code generation circuit 2 are sequentially decoded in synchronization with the internal clock signal, and each of the latch registers A through F is accessed based on the decoding results. The processing circuit 1 accesses a prescribed one of the latch registers A through F by a latch register selection signal being supplied to the prescribed one of the latch registers A through F via the latch register selection signal line 31. The internal control signal output from the processing circuit 1 is written in the latch register which is selected by the latch register selection signal, and thus the latch data is updated. Also, data in the selected latch register is read and supplied to the processing circuit 1.

Data in the latch registers A through F is supplied to the functional blocks, for example, the internal voltage generation circuit 25. For example, the latch register A outputs a voltage raising circuit activation signal for raising the internal voltage. The latch register B outputs a voltage dropping circuit activation signal for dropping the internal voltage. The latch register C outputs a pulse application activation signal for applying a write pulse voltage or an erase pulse voltage to a memory cell. Each functional block operates in accordance with the internal control signal. Thus, the algorithms described in the control codes are processed.

In the first example, the cycle of the internal clock signal can be initially set to a cycle which is suitable for the voltage characteristics of the voltage raising circuit in accordance with the supply voltage. The control code generation circuit 2 includes a control code for extending the cycle of the internal clock signal and a control code for returning the cycle to its original clock (i.e., for shortening the cycle). These control codes are supplied from the control code generation circuit 2 to the processing circuit 1.

The processing circuit 1 includes a clock cycle control signal generation circuit. When a control code for extending the cycle of the internal clock signal is supplied from the control code generation circuit 2, the clock cycle control signal generation circuit outputs a clock cycle control signal for extending the cycle of the internal clock signal to the internal clock generation circuit 3. When a control code for returning the cycle of the internal clock signal to its original cycle (i.e., for shortening the cycle) is supplied from the control code generation circuit 2, the clock cycle control signal generation circuit outputs a clock cycle control signal for returning the cycle of the internal clock signal to the internal clock generation circuit 3.

Figure 2:
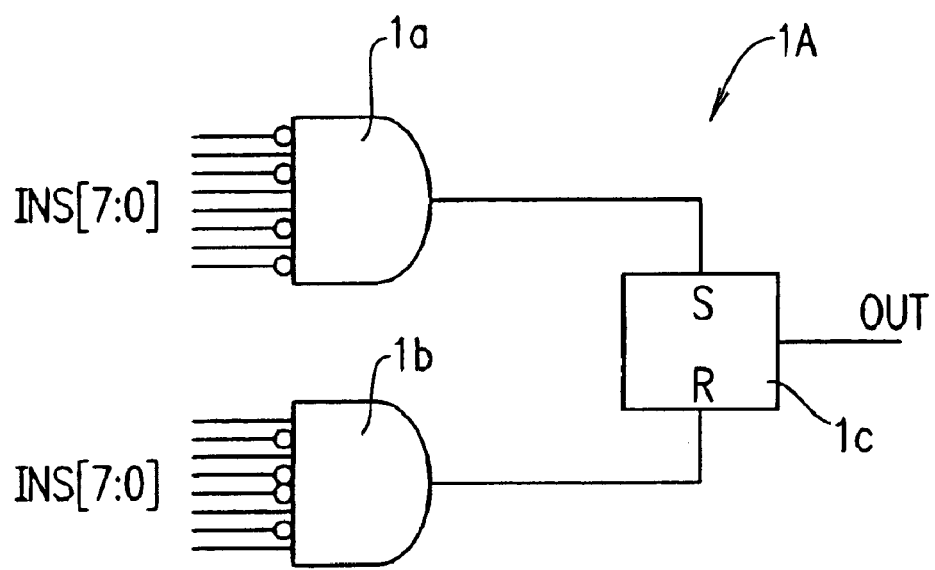
FIG. 2 is a circuit diagram illustrating a partial structure of a clock cycle control signal generation circuit included in a processing circuit in the write state machine shown in FIG. 1.

FIG. 2 is a circuit diagram illustrating a partial structure of the clock cycle control signal generation circuit (represented with 1A in FIG. 2) included in the processing circuit 1 (FIG. 1).

As shown in FIG. 2, the clock cycle control signal generation circuit 1A includes decoders 1a and 1b and a latch register 1c. For example, an 8-bit control code supplied by the control code generation circuit 2 (FIG. 1) is input to each of the decoders 1a and 1b via a bus line. An output from the decoder 1a is input to a set terminal S of the latch register 1c, and an output from the decoder 1b is input to a reset terminal R of the latch register 1c. An output OUT from the latch register 1c is supplied to the internal clock generation circuit 3 as a clock cycle control signal.

For example, in the case where the control code for extending the clock cycle is INS[7:0]="01011010", and the control code for returning the clock cycle is INS[7:0]= "10100101", when the control code for extending the clock cycle is input to the processing circuit 1, data "1" is output from the decoder 1a and the latch register 1a having the set terminal S and the reset terminal R is placed into a set state. Thus, the output OUT from the latch register 1e is "1", and a clock cycle control signal "1" is supplied to the internal clock generation circuit 3.

When the control code for returning the clock cycle is input to the processing circuit 1, data "0" is output from the decoder 1a and the latch register 1c having the set terminal S and the reset terminal R is placed into a reset state. Thus, the output OUT from the latch register 1c is "0", and a clock cycle control signal "0" is supplied to the internal clock generation circuit 3.

The internal clock generation circuit 3 is controlled to generate an internal clock signal for extending the clock cycle when the clock cycle control signal supplied from the processing circuit 1 is "1" and shortening the clock cycle when the clock cycle control signal supplied from the processing circuit 1 is "0".

Figure 3:
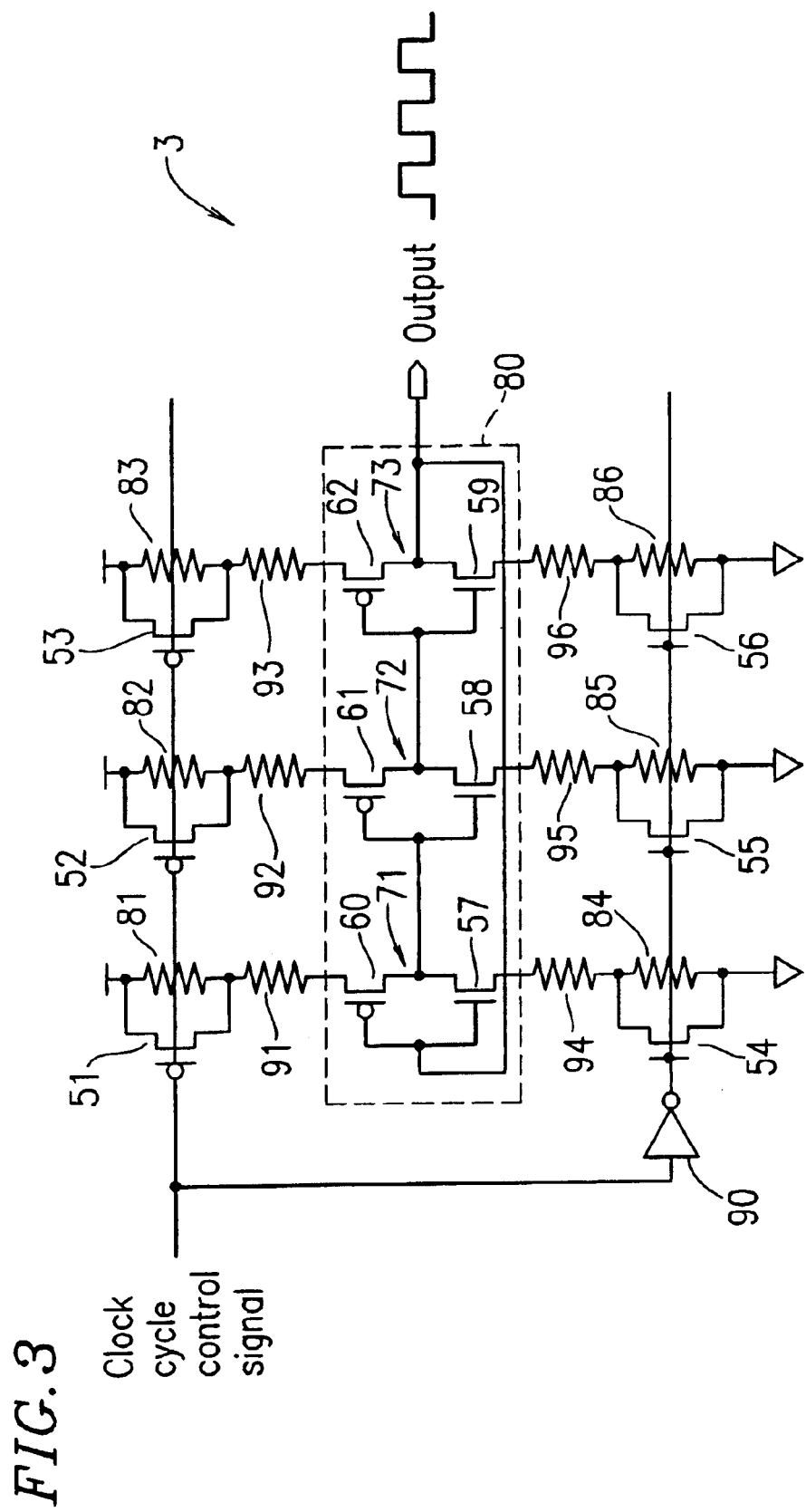
FIG. 3 is a circuit diagram illustrating a partial structure of an internal clock generation circuit in the write state machine shown in FIG. 1.

FIG. 3 is a circuit diagram illustrating a partial structure of the internal clock generation circuit 3.

As shown in FIG. 3, the internal clock generation circuit 3 includes a ring oscillator 80. The ring oscillator 80 includes an inverter 71 including an n-channel MOS transistor 57 and a p-channel MOS transistor 60, an inverter 72 including an n-channel MOS transistor 58 and a p-channel MOS transistor 61, and an inverter 73 including an n-channel MOS transistor 59 and a p-channel MOS transistor 62. The inverters 71, 72 and 73 are connected in series. An output from the inverter 73 is sent to an input end of the inverter 71. A source of the p-channel MOS transistor 60 is connected to a power supply via a resistor 91 and a resistor 81. A source of the n-channel MOS transistor 57 is grounded via a resistor 94 and a resistor 84. A source of the p-channel MOS transistor 61 is connected to the power supply via a resistor 92 and a resistor 82. A source of the n-channel MOS transistor 58 is grounded via a resistor 95 and a resistor 85. A source of the p-channel MOS transistor 62 is connected to the power supply via a resistor 93 and a resistor 83. A source of the n-channel MOS transistor 59 is grounded via a resistor 96 and a resistor 86. Both ends of the resistors 81, 82 and 83 are connected to a source and a drain of the p-channel MOS transistors 51, 52 and 53, respectively. Both ends of the resistors 84, 85 and 86 are connected to a source and a drain of the n-channel MOS transistors 54, 55 and 56, respectively. A gate of each of the p-channel transistors 51, 52 and 53 receives a clock cycle control signal from the processing circuit 1. A gate of each of the n-channel MOS transistors 54, 55 and 56 receives the clock cycle control signal from the processing circuit 1 in an inverted state.

When, for example, a clock cycle control signal "1" is supplied from the processing circuit 1, the p-channel MOS transistors 51 through 53 and the n-channel MOS transistors 54 through 56 are turned off. As a result, the resistance between the source and the ground potential of each of the n-channel MOS transistors 57 through 59 included in the ring oscillator 80 is increased. The resistance between the source and the ground potential of each of the p-channel MOS transistors 60 through 62 included in the ring oscillator 80 is also increased. Therefore, the cycle of the internal clock signal output from the ring oscillator 80 is extended.

In this case, the cycle of the internal clock signal is set to be, for example, a clock cycle which is suitable for data write and data erase, with the dependency on the supply voltage being minimized. Alternatively, the cycle of the internal clock signal is set to be, for example, a clock cycle which is suitable for accessing the latch registers D through F, which are located relatively far from, and thus are more time-consuming to be accessed by, the processing circuit 1, among the latch registers A through F.

When a clock cycle control signal "0" is supplied from the processing circuit 1, the p-channel MOS transistors 51 through 53 and the n-channel MOS transistors 54 through 56 are turned on. As a result, the resistance between the source and the ground potential of each of the n-channel MOS transistors 57 through 59 included in the ring oscillator 80 is decreased. The resistance between the source and the ground potential of each of the p-channel MOS transistors 60 through 62 included in the ring oscillator 80 is also decreased. Therefore, the cycle of the internal clock signal output from the ring oscillator 80 is shortened.

In this case, the cycle of the internal clock signal is set to be, for example, a clock cycle which is suitable for the voltage characteristics of the voltage raising circuit or the voltage dropping circuit in accordance with the supply voltage. Alternatively, the cycle of the internal clock signal is set to be, for example, a clock cycle which is suitable for accessing the latch registers A through C, which are located relatively close to, and thus are less time-consuming to be accessed by, the processing circuit 1, among the latch registers A through F.

Figure 4:
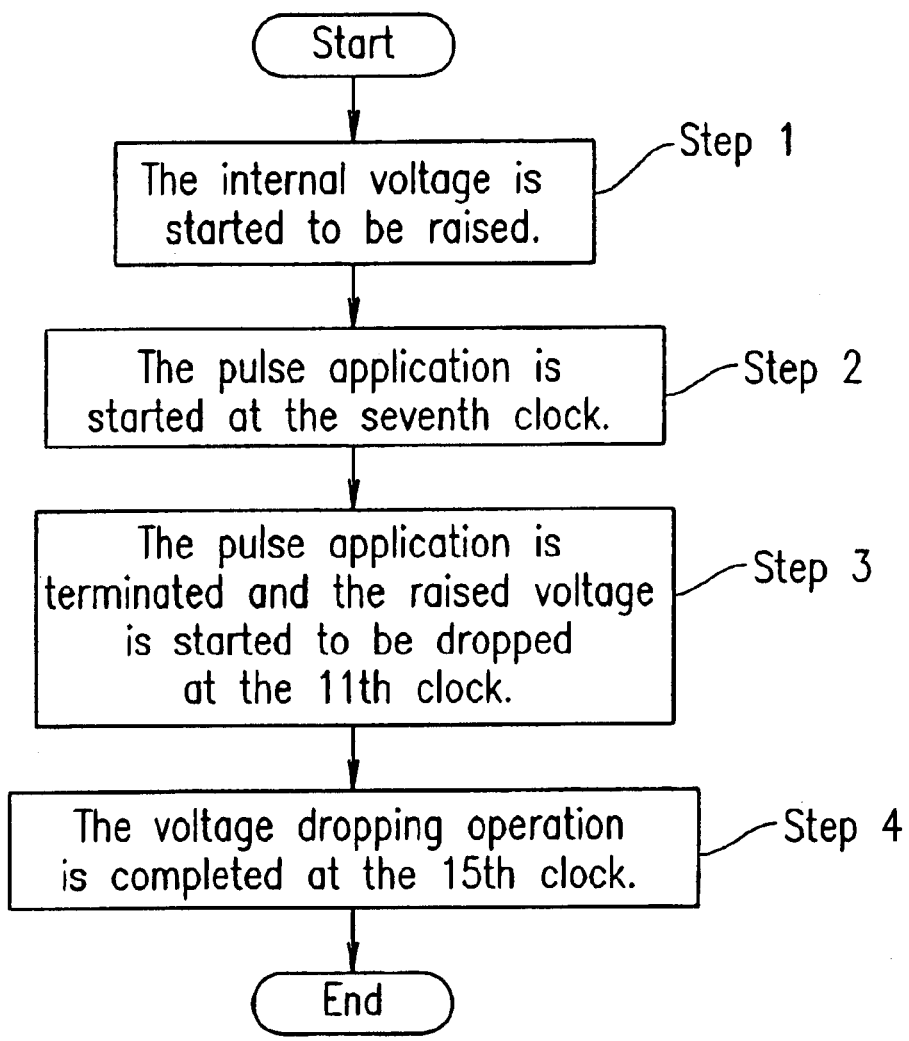
FIG. 4 is a flowchart illustrating an operation of executing an algorithm by the write state machine shown in FIG. 1.

FIG. 4 is a flowchart illustrating an operation of executing the algorithm by the write state machine 24A shown in FIG. 1. As shown in FIG. 4, the internal voltage is raised for an operation of writing data to or erasing data from the memory cell, next a write pulse voltage or an erase pulse voltage is applied, and then the raised internal voltage is dropped. Thus, the execution of the algorithm is terminated. The numbers of clocks shown in FIG. 4 are merely exemplary and the present invention is not limited to these numbers.

As shown in FIG. 4, when the processing circuit 1 accesses the latch register A at the first clock, data "1" is written in the latch register A and the voltage raising circuit activation signal output from the latch register A is enabled ("1") and supplied to the voltage raising circuit in the internal voltage generation circuit 25. The voltage raising circuit in the internal voltage generation circuit 25 starts raising the internal voltage (step 1). The voltage raising operation is completed by the seventh clock.

When the processing circuit 1 accesses the latch register D at the seventh clock, data "1" is written in the latch register D and the pulse application activation signal output from the latch register D is enabled ("1") and supplied to the internal voltage generation circuit 25. The internal voltage generation circuit 25 starts applying a write pulse voltage or an erase pulse voltage to a memory cell.

When the processing circuit 1 accesses the latch register D before the 11th clock, the data in the latch register D is updated to "0" and the pulse application activation signal output from the latch register D is disabled ("0") and supplied to the internal voltage generation circuit 25. The internal voltage generation circuit 25 terminates applying the write pulse voltage or the erase pulse voltage to the memory cell.

When the processing circuit 1 accesses the latch register B at the 11th clock, data "1" is written to the latch register B and the voltage dropping circuit activation signal output from the latch register B is enabled ("1") and supplied to the voltage dropping circuit in the internal voltage generation circuit 25. The voltage dropping circuit in the internal voltage generation circuit 25 starts dropping the internal voltage (step 3). When the voltage dropping operation is completed in four clocks, the control of the algorithm by the write state machine 24A is terminated at the 15th clock (step 4).

Figure 5:
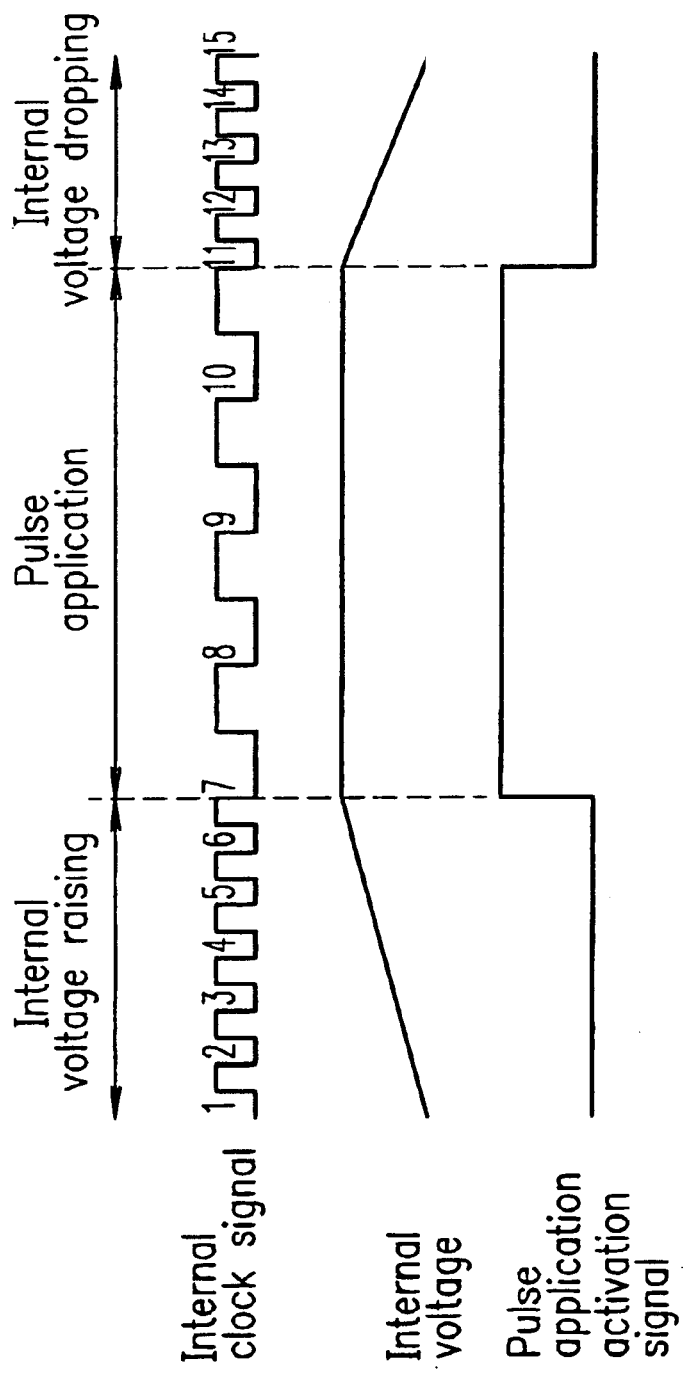
FIG. 5 is a timing diagram illustrating a relationship between an internal clock signal, an internal voltage, and a pulse application activation signal in the write state machine shown in FIG. 1.

FIG. 5 shows the relationship between the internal clock signal, the internal voltage, and the pulse application activation signal in the write state machine 24A. FIG. 5 shows waveforms of the internal clock signal and the pulse application activation signal.

As shown in FIG. 5, for raising the internal voltage, the cycle of the internal clock signal is set to be a clock cycle which is suitable for the voltage characteristics of the voltage raising circuit in the internal voltage generation circuit 25, in accordance with the supply voltage. Owing to such setting, production of extra wait time from the completion of the voltage raising operation of the internal voltage until the start of the application of a write pulse voltage or an erase pulse voltage can be prevented.

In the case where the cycle of the internal clock signal is fixed to a clock cycle which is suitable for the voltage characteristics of the internal voltage generation circuit 25, the following problem arises. Under the condition of a low supply voltage, the clock cycle is set to be relatively long, and thus the pulse width of a write pulse voltage or an erase pulse voltage can be sufficient to properly perform data write or data erase. However, under the condition of a high supply voltage, the clock cycle is set to be relatively short, and thus the pulse width of a write pulse voltage or an erase pulse voltage is too short to properly perform data write or data erase.

In order to avoid this problem, in this example, a control code for extending the cycle of the internal clock signal is supplied from the control code generation circuit 2 to the processing circuit 1, before the write pulse voltage or the erase pulse voltage is applied. When this is conducted, the clock cycle control signal generation circuit 1A (FIG. 2) generates a clock cycle control signal "1" and supplies the signal to the internal clock generation circuit 3. Upon receipt of the clock cycle control signal "1", the internal clock generation circuit 3 generates an internal clock signal having a relatively long clock cycle. As a result, the pulse width of the write pulse voltage or the erase pulse voltage is sufficiently long to properly perform data write to or data erase from the memory cell.

After the application of the write pulse voltage or the erase pulse voltage is terminated, a control code for returning (i.e., shortening) the cycle of the internal clock signal is supplied from the control code generation circuit 2 to the processing circuit 1. When this is conducted, the clock cycle control signal generation circuit 1A generates a clock cycle control signal "0" and supplies the signal to the internal clock generation circuit 3. Upon receipt of the clock cycle control signal "0", the internal clock generation circuit 3 generates an internal clock signal having a clock cycle which is shorter and is suitable for the voltage characteristics of the voltage dropping circuit. As a result, no extra wait time is produced from the completion of the voltage dropping operation of the internal voltage until the termination of the processing.

As described above, in the first example, the speed of data write to or data erase from a memory cell is enhanced by substantially eliminating extra wait time during the operation of raising or dropping the internal voltage. In addition, the write characteristics and the erase characteristics are kept constant by obtaining a sufficient pulse width during the operation of applying a write pulse voltage or an erase pulse voltage.

EXAMPLE 2

In the first example, the internal control signal generation circuit 4A includes a clock cycle control signal generation section 1A for supplying the internal clock generation circuit 3 with a clock cycle control signal as an internal control signal for changing the clock cycle. In a second example, an internal control signal generation circuit 4B includes a clock cycle control signal latch section 5B for supplying the internal clock generation circuit 3 with a clock cycle control signal as an internal control signal for changing the clock cycle.

Figure 6:
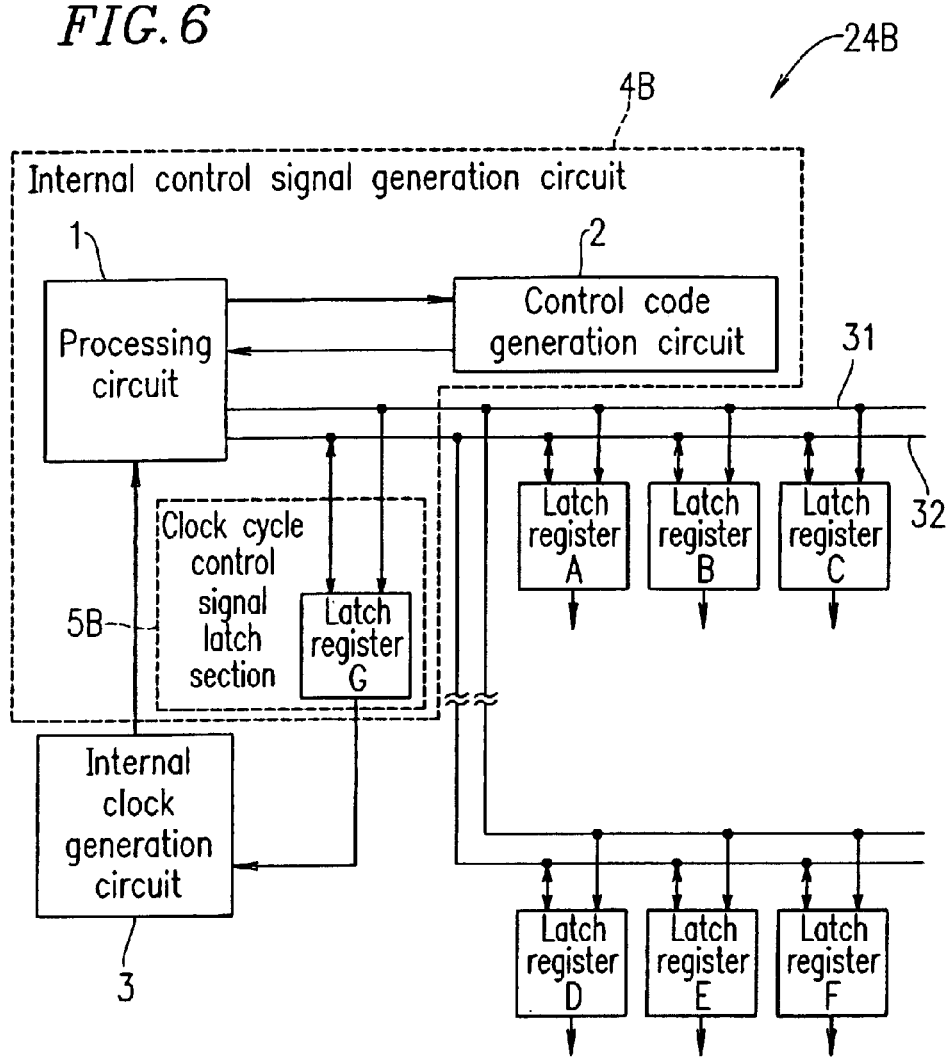
FIG. 6 is a block diagram illustrating a partial structure of a write state machine included in a flash memory according to a second example of the present invention.

FIG. 6 is a block diagram illustrating a partial structure of a write state machine 24B included in a flash memory according to the second example of the present invention.

As shown in FIG. 6, the write state machine 24B includes a processing circuit 1 for executing various types of processing, a control code generation circuit 2 for supplying the processing circuit 1 with a control code, an internal clock generation circuit 3 for supplying the processing circuit 1 with a timing signal (internal clock signal), and a plurality of latch registers A through G (latch sections) connected to the processing circuit 1.

In the write state machine 24A shown in FIG. 1, the processing circuit 1 supplies a clock cycle control signal to the internal clock generation circuit 3. In contrast, the write state machine 24B shown in FIG. 6 includes the latch register G which is accessible by the processing circuit 1 so as to have its data updated, independently from the latch registers A through F. The data in the latch register G is supplied to the internal clock generation circuit 3 as a clock cycle control signal.

With this structure, it is not necessary to provide a special control code for controlling the cycle of the internal clock signal in the control code generation circuit 2 and the processing circuit 1. The cycle of the internal clock signal can be extended by a control code for writing data "1" in the latch register G, and the cycle of the internal clock signal can be returned to the default cycle (i.e., shortened) by a control code for writing data "0" in the latch register G.

In this case also, as shown in FIG. 5, for raising the internal voltage, the cycle of the internal clock signal is set to be a clock cycle which is suitable for the voltage characteristics of the voltage raising circuit in accordance with the supply voltage. Owing to such setting, production of extra wait time from the completion of the voltage raising operation of the internal voltage until the start of the application of a write pulse voltage or an erase pulse voltage can be prevented.

Immediately before a write pulse voltage or an erase pulse voltage is applied, a control code for writing data "1" to the latch register G is supplied to the processing circuit 1. Upon receipt of such a control code, the processing circuit 1 writes data "1" to the latch register G, and the latch register G outputs a clock cycle control signal "1" to the internal clock generation circuit 3. Upon receipt of the clock cycle control signal "1", the internal clock generation circuit 3 generates an internal clock signal having an extended clock cycle. Thus, a write pulse voltage or an erase pulse voltage having a pulse width which is sufficient to properly perform data write to or data erase from a memory cell is obtained.

After the application of the write pulse voltage or the erase pulse voltage is terminated, a control code for writing data "0" to the latch register G is supplied to the processing circuit 1. Upon receipt of such a control code, the processing circuit 1 writes data "0" to the latch register G, and the latch register G outputs a clock cycle control signal "0" to the internal clock generation circuit 3. Upon receipt of the clock cycle control signal "0", the internal clock generation circuit 3 generates an internal clock signal having an shortened clock cycle. Thus, the clock cycle is returned to the cycle which is suitable for the voltage dropping circuit, which prevents production of extra wait time from the completion of the voltage dropping operation of the internal voltage until the termination of the processing.

Figure 7:
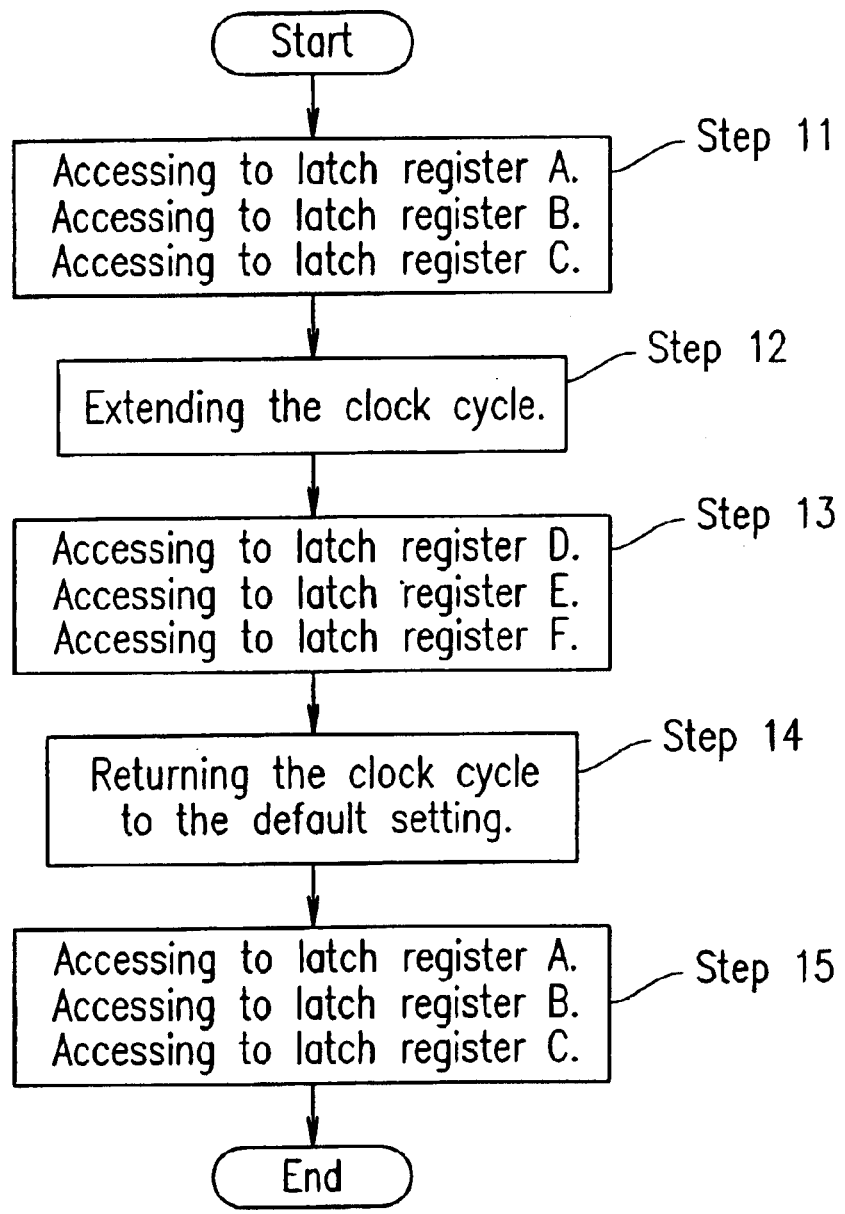
FIG. 7 is a flowchart illustrating a flow of an accessing operation by a processing circuit to latch registers in the write state machine shown in FIG. 6.
Figure 8:
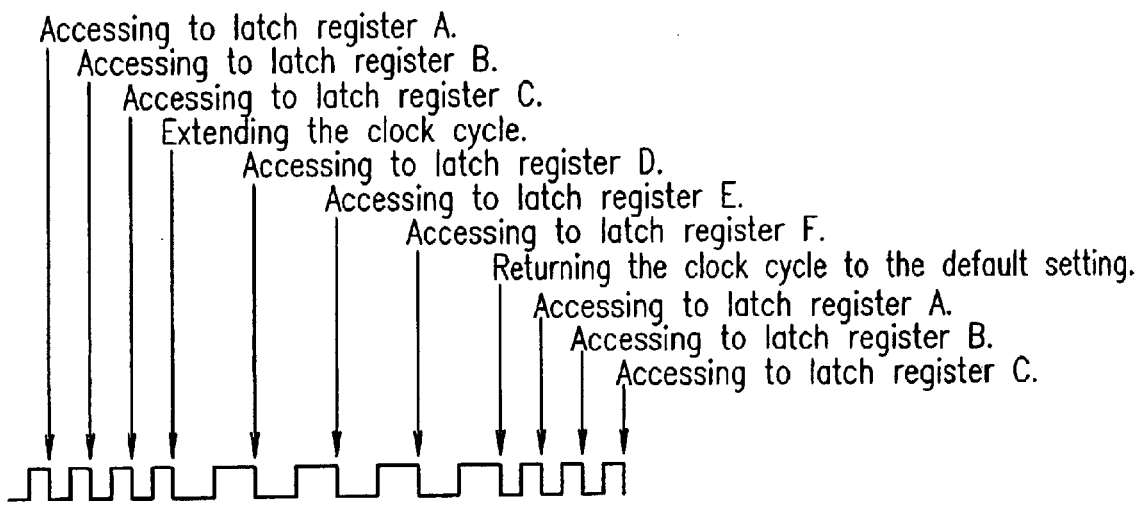
FIG. 8 is a timing diagram illustrating a relationship between an internal clock signal and an accessing operation by the processing circuit to the latch registers in the write state machine 24B shown in FIG. 6.

FIG. 7 is a flowchart illustrating a flow of an accessing operation by the processing circuit 1 in the write state machine 24B (FIG. 6) to the latch registers A through G. FIG. 8 is a timing diagram illustrating the relationship between the internal clock signal and the accessing operation of the processing circuit 1 to the latch registers A through G in the write state machine 24B (FIG. 6). One latch register is accessed in one clock cycle.

As shown in FIGS. 7 and 8, in step 11, the latch registers A, B and C, which are located relatively close to the processing circuit 1, are sequentially accessed. At this point, the cycle of the internal clock signal is set to a clock cycle which is suitable for accessing the latch registers A through C, which are located relatively close to, and thus are less time-consuming to be accessed by, the processing circuit 1, among the plurality of latch registers.

In step 12, a control code for extending the cycle of the internal clock signal is supplied from the control code generation circuit 2 to the processing circuit 1. In accordance with the control code, the clock control signal generation circuit 1A (FIG. 2) generates a clock cycle control signal "1", or the processing circuit 1 accesses the latch register G (FIG. 6) and the latch register G outputs a clock cycle control signal "1". Then, the clock cycle control signal "1" is supplied to the internal clock generation circuit 3. The internal clock generation circuit 3 generates an internal clock signal having an extended clock cycle which is sufficient to guarantee access of the processing circuit 1 to the latch registers D through F, which are located relatively far from the processing circuit 1.

In step 13, the latch registers D, E and F are sequentially accessed in synchronization with the internal clock signal having the extended clock cycle.

In step 14, a control code for returning the cycle of the internal clock signal to the default cycle is supplied from the control code generation circuit 2. In accordance with the control code, the clock control signal generation circuit 1A (FIG. 2) generates a clock cycle control signal "0", or the processing circuit 1 accesses the latch register G (FIG. 6) and the latch register G outputs a clock cycle control signal "0". Then, the clock cycle control signal "0" is supplied to the internal clock generation circuit 3. The internal clock generation circuit 3 generates an internal clock signal having a shorter clock cycle which is suitable for accessing the latch registers A through C, which are located relatively close to the processing circuit 1.

In step 15, the latch registers A through C are sequentially accessed.

As described above, in the second example, the cycle of an internal clock signal is controlled (i) so that extra wait time is substantially eliminated when accessing a latch register which can be accessed by the processing circuit 1 in a short period of time so as to enhance the speed of data write to and data erase from a memory cell, and (ii) so that a sufficient access time is guaranteed for accessing a latch register which requires a relatively long access time by the processing circuit 1 so as to maintain the write characteristics and erase characteristics constant.

Figure 17:
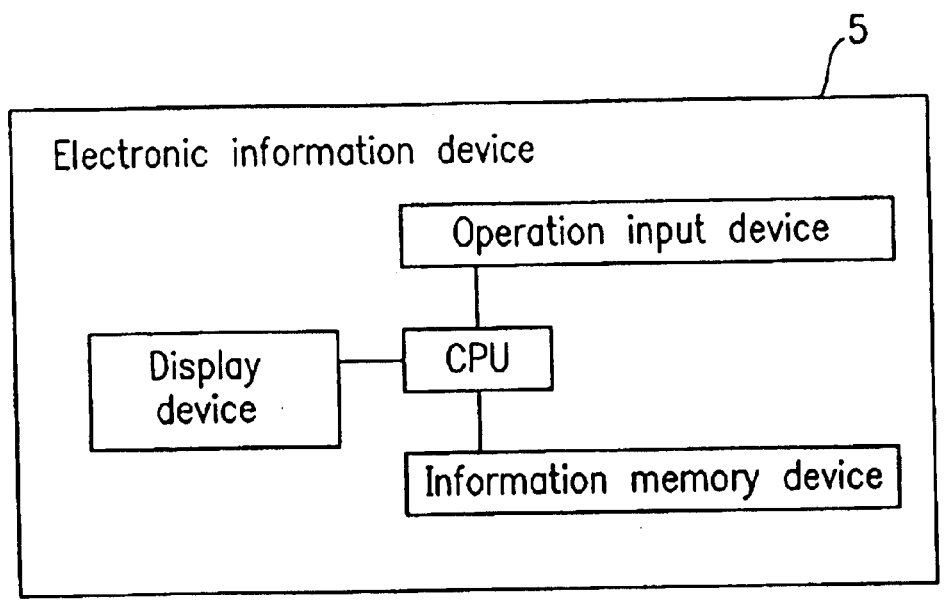
FIG. 17 is a block diagram illustrating a basic structure of an electronic information device to which a semiconductor memory device according to the present invention is applied.

The first and second examples relate to a semiconductor memory device according to the present invention. The semiconductor memory device according to the present invention can be easily incorporated in an electronic information device such as, for example, a cellular phone or a computer, with the effect of the present invention being provided. One such example is an electronic information device 5 shown in FIG. 17. The electronic information device 5 includes an information memory device such as a flash memory, an operation input device, a display device for displaying, for example, an initial screen or an information processing result, and a CPU (central processing unit) for receiving various operation instructions from the operation input device (e.g., input operations for various functions of a cellular phone) and performing various types of processing based on a prescribed information processing program or data obtained therefrom.

The semiconductor memory device according to the present invention, which varies the cycle of an internal clock signal in accordance with the operation time characteristics of various memory operations, can be conveniently used as the information memory device.

As described above, according to the present invention, an internal control signal generation circuit controls an internal clock generation circuit so as to switch the cycle of the internal clock signal. Owing to such a structure, for raising or dropping the internal voltage, the cycle of the clock signal can be set to a cycle which is suitable for the voltage characteristics (operation time characteristics) of a voltage raising circuit or a voltage dropping circuit in the internal voltage generation circuit, in accordance with the externally input supply voltage. Therefore, extra wait time can be substantially eliminated from the completion of the voltage raising operation of the internal voltage until the start of the application of a write pulse voltage or an erase pulse voltage, and from the completion of the voltage dropping operation of the internal voltage until the termination of the processing, respectively. This improves the speed of data write to or data erase from a memory cell. For applying a write pulse voltage or an erase pulse voltage to a memory cell, the cycle of the internal clock signal is switched so as to be a cycle which is suitable for the data write or data erase (operation time characteristics). This allows the write pulse voltage or the erase pulse voltage to have a pulse width which is sufficient to properly perform data write or data erase. Therefore, the write characteristics and erase characteristics can be maintained constant.

According to the present invention, the cycle of the internal clock signal is switchable as described above. Therefore, the clock cycle for accessing a latch section which is located relatively close to a processing circuit and thus can be accessed by the processing circuit in a short access time is set to be relatively short. Thus, extra wait time is substantially eliminated, so as to enhance the speed of data write to and data erase from a memory cell. The clock cycle for accessing a latch section which is located relatively far from the processing circuit and thus requires a long access time by the processing circuit is set to be relatively long. Thus, a sufficient access time is guaranteed for accessing the latch section far from the processing circuit, so as to maintain the write characteristics and the erase characteristics constant.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device for performing a memory operation by controlling an internal voltage and a memory operation voltage, wherein a cycle of an internal clock signal is varied in accordance with operation time characteristics of the memory operation.

2. A semiconductor memory device according to claim 1, comprising:
   an internal clock generation circuit for generating the internal clock signal with different cycles; and
   an internal control signal generation circuit including a plurality of latch sections capable of latching latch data and a processing circuit for accessing the plurality of latch sections to write and read the latch data in synchronization with the internal clock signal,
   wherein the internal control signal generation circuit generates a second internal control signal for controlling the cycle of the internal clock signal to be switched in accordance with the operation time characteristics when the processing circuit accesses the latch sections, and outputting the second internal control signal to the internal clock generation circuit.

3. An electronic information device using a semiconductor memory device according to claim 1 to vary the cycle of the internal clock signal in accordance with an operation time characteristic of the memory operation so as to shorten a time required for the memory operation.

4. A semiconductor memory device for performing a memory operation such as data write to or data erase from a memory cell by sequentially controlling raising of an internal voltage to a prescribed voltage, application of a memory operation voltage for writing data to or erasing data from the memory cell, and dropping of the raised internal voltage to a prescribed voltage, wherein a cycle of an internal clock signal is varied in accordance with an operation time characteristic of the memory operation.

5. A semiconductor memory device according to claim 1, comprising:
   an internal clock generation circuit for generating the internal clock signal with different cycles; and
   an internal control signal generation circuit for generating a first internal control signal for controlling the cycle of the internal clock signal to be switched in accordance with the operation time characteristics when the internal voltage is raised and when the internal voltage dropped and operation time characteristics when the write voltage is applied and when the erase voltage is applied.

6. A semiconductor memory device according to claim 4, comprising:
   an internal clock generation circuit for generating the internal clock signal with different cycles; and
   an internal control signal generation circuit for generating a first internal control signal for controlling the cycle of the internal clock signal to be switched in accordance with the operation time characteristics when the internal voltage is raised and when the internal voltage dropped and operation time characteristics when the write voltage is applied and when the erase voltage is applied.

7. A semiconductor memory device according to claim 6, wherein the internal control signal generation circuit generates the first internal control signal for switching the cycle of the internal clock signal, such that the cycle of the internal clock signal for controlling the raising of the internal voltage and the dropping of the raised internal voltage is shorter than the cycle of the internal clock signal for controlling the application of the write voltage and the erase voltage.

8. A semiconductor memory device according to claim 6, comprising:
   a memory array including a plurality of memory cells in a row direction and a column direction; and
   an internal voltage generation circuit for raising a supply voltage to generate the internal voltage which is required for data write to and data erase from the memory cells and for dropping the raised internal voltage,
   wherein the internal control signal generation circuit generates a third internal control signal for controlling the raising of the internal voltage, the dropping of the raised internal voltage performed by the internal voltage generation circuit and for controlling the application of a write pulse voltage for writing data to the memory cells and an erase pulse voltage for erasing data from the memory cells.

9. A semiconductor memory device according to claim 6, wherein the internal control signal generation circuit includes a control code generation circuit having a built-in control code describing an algorithm for executing an operation instructed by an externally input command, wherein the internal control signal generation circuit generates the first internal control signal such that the control code generation circuit supplies the control code corresponding to the command and the algorithm described in the control code is sequentially executed.

10. A semiconductor memory device according to claim 9, wherein the internal control signal generation circuit further includes a clock cycle control signal generation section for supplying the internal clock generation circuit with a clock cycle control signal as the first or the second internal control signal for varying the cycle of the internal clock signal, wherein:

the control code generation circuit further stores a control code for extending the cycle of the internal clock signal and a control code for shortening the cycle of the internal clock signal, when the control code for extending the cycle of the internal clock signal is supplied to the internal control signal generation circuit from the control code generation circuit, the clock cycle control signal generation section outputs the first or the second internal control signal for extending the cycle of the internal clock signal to the internal clock generation circuit, and when the control code for shortening the cycle of the internal clock signal is supplied to the internal control signal generation circuit from the control code generation circuit, the clock cycle control signal generation section outputs the first or the second internal control signal for shortening the cycle of the internal clock signal to the internal clock generation circuit.

11. A semiconductor memory device according to claim 10, wherein the control code for extending the cycle of the internal clock signal is supplied from the control code generation circuit to the internal control signal generation circuit when an operation for applying a write pulse voltage or an erase pulse voltage to the memory cells as the write voltage or the erase voltage is controlled or when a latch section which is located relatively far from the processing circuit is accessed, and the control code for shortening the cycle of the internal clock signal is supplied from the control code generation circuit to the internal control signal generation circuit when an operation for applying a write pulse voltage or an erase pulse voltage to the memory cells as the write voltage or the erase voltage is controlled or when a latch section which is located relatively close to the processing circuit is accessed.

12. A semiconductor memory device according to claim 9, wherein the internal control signal generation circuit further includes a clock cycle control signal latch section for supplying the internal clock generation circuit with a clock cycle control signal as the first or the second internal control signal for varying the cycle of the internal clock signal, wherein:

the control code generation circuit further stores a control code for extending the cycle of the internal clock signal and a control code for shortening the cycle of the internal clock signal, when the control code for extending the cycle of the internal clock signal is supplied to the internal control signal generation circuit from the control code generation circuit, latch data in the clock cycle control signal latch section is updated and the clock cycle control signal latch section outputs the first or the second internal control signal for extending the cycle of the internal clock signal to the internal clock generation circuit, and when the control code for shortening the cycle of the internal clock signal is supplied to the internal control signal generation circuit from the control code generation circuit, latch data in the clock cycle control signal latch section is updated and the clock cycle control signal latch section outputs the first or the second internal control signal for shortening the cycle of the internal clock signal to the internal clock generation circuit.

13. A semiconductor memory device according to claim 4, comprising:

an internal clock generation circuit for generating the internal clock signal with different cycles; and an internal control signal generation circuit including a plurality of latch sections capable of latching latch data and a processing circuit for accessing the plurality of latch sections to write and read the latch data in synchronization with the internal clock signal, wherein the internal control signal generation circuit generates a second internal control signal for controlling the cycle of the internal clock signal to be switched in accordance with the operation time characteristics when the processing circuit accesses the latch sections, and outputting the second internal control signal to the internal clock generation circuit.

14. A semiconductor memory device according to claim 13, wherein the internal control signal generation circuit generates the second internal control signal for switching the cycle of the internal clock signal, such that the cycle of the internal clock signal when one of the latch sections which is located relatively close to the processing circuit among the plurality of latch sections is accessed is shorter than the cycle of the internal clock signal when one of the latch sections which is located far from the processing circuit among the plurality of latch sections is accessed.

15. A semiconductor memory device according to claim 13, comprising:

a memory array including a plurality of memory cells in a row direction and a column direction; and an internal voltage generation circuit for raising a supply voltage to generate the internal voltage which is required for data write to and data erase from the memory cells and for dropping the raised internal voltage, wherein the internal control signal generation circuit generates a third internal control signal for controlling the raising of the internal voltage, the dropping of the raised internal voltage performed by the internal voltage generation circuit and for controlling the application of a write pulse voltage for writing data to the memory cells and an erase pulse voltage for erasing data from the memory cells.

16. A semiconductor memory device according to claim 13, wherein the internal control signal generation circuit includes a control code generation circuit having a built-in control code describing an algorithm for executing an operation instructed by a command externally input, wherein the internal control signal generation circuit generates the second internal control signal such that the control code generation circuit supplies the control code corresponding to the command and the algorithm described in the control code is sequentially executed.

17. A semiconductor memory device according to claim 16, wherein the internal control signal generation circuit further includes a clock cycle control signal generation section for supplying the internal clock generation circuit with a clock cycle control signal as the first or the second internal control signal for varying the cycle of the internal clock signal, wherein:

the control code generation circuit further stores a control code for extending the cycle of the internal clock signal and a control code for shortening the cycle of the internal clock signal, when the control code for extending the cycle of the internal clock signal is supplied to the internal control signal generation circuit from the control code generation circuit, the clock cycle control signal generation section outputs the first or the second internal control signal for extending the cycle of the internal clock signal to the internal clock generation circuit, and when the control code for shortening the cycle of the internal clock signal is supplied to the internal control signal generation circuit from the control code generation circuit, the clock cycle control signal generation section outputs the first or the second internal control signal for shortening the cycle of the internal clock signal to the internal clock generation circuit.

18. A semiconductor memory device according to claim 16, wherein the internal control signal generation circuit further includes a clock cycle control signal latch section for supplying the internal clock generation circuit with a clock cycle control signal as the first or the second internal control signal for varying the cycle of the internal clock signal, wherein:

the control code generation circuit further stores a control code for extending the cycle of the internal clock signal and a control code for shortening the cycle of the internal clock signal, when the control code for extending the cycle of the internal clock signal is supplied to the internal control signal generation circuit from the control code generation circuit, latch data in the clock cycle control signal latch section is updated and the clock cycle control signal latch section outputs the first or the second internal control signal for extending the cycle of the internal clock signal to the internal clock generation circuit, and when the control code for shortening the cycle of the internal clock signal is supplied to the internal control signal generation circuit from the control code generation circuit, latch data in the clock cycle control signal latch section is updated and the clock cycle control signal latch section outputs the first or the second internal control signal for shortening the cycle of the internal clock signal to the internal clock generation circuit.

19. A semiconductor memory device according to claim 18, wherein the control code for extending the cycle of the internal clock signal is supplied from the control code generation circuit to the internal control signal generation circuit when an operation for applying a write pulse voltage or an erase pulse voltage to the memory cells as the write voltage or the erase voltage is controlled or when a latch section which is located relatively far from the processing circuit is accessed, and the control code for shortening the cycle of the internal clock signal is supplied from the control code generation circuit to the internal control signal generation circuit when an operation for applying a write pulse voltage or an erase pulse voltage to the memory cells as the write voltage or the erase voltage is controlled or when a latch section which is located relatively close to the processing circuit is accessed.

20. An electronic information device using a semiconductor memory device according to claim 4 to vary the cycle of the internal clock signal in accordance with an operation time characteristic of the memory operation so as to shorten a time required for the memory operation.

* * * * *